(12) United States Patent
Utsumi

(10) Patent No.: US 11,862,288 B2
(45) Date of Patent: Jan. 2, 2024

(54) SEMICONDUCTOR STORAGE DEVICE

(71) Applicant: KIOXIA CORPORATION, Tokyo (JP)

(72) Inventor: Tetsuaki Utsumi, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/410,244

(22) Filed: Aug. 24, 2021

(65) Prior Publication Data

US 2021/0383845 A1 Dec. 9, 2021

Related U.S. Application Data

(63) Continuation of application No. 17/010,569, filed on Sep. 2, 2020, now Pat. No. 11,127,441.

(30) Foreign Application Priority Data

Mar. 23, 2020 (JP) .................................. 2020-051634

(51) Int. Cl.
| | | |
|---|---|---|
| *G11C 7/10* | (2006.01) | |
| *G11C 11/4074* | (2006.01) | |
| *G11C 11/408* | (2006.01) | |
| *G11C 5/06* | (2006.01) | |

(52) U.S. Cl.
CPC ............. *G11C 7/1063* (2013.01); *G11C 5/06* (2013.01); *G11C 7/106* (2013.01); *G11C 7/1069* (2013.01); *G11C 7/1087* (2013.01); *G11C 11/408* (2013.01); *G11C 11/4074* (2013.01)

(58) Field of Classification Search
CPC ......... G11C 7/1063; G11C 5/06; G11C 7/106; G11C 7/1069; G11C 7/1087
See application file for complete search history.

(56) References Cited

U.S. PATENT DOCUMENTS

| | | |
|---|---|---|
| 2008/0074930 A1 | 3/2008 | Kanda |
| 2008/0309372 A1 | 12/2008 | Monden et al. |
| 2009/0196102 A1 | 8/2009 | Kim |
| 2016/0322112 A1 | 11/2016 | Nakano et al. |
| 2017/0288634 A1 | 10/2017 | Kang et al. |
| 2017/0357581 A1 | 12/2017 | Yanagidaira et al. |
| 2018/0053567 A1 | 2/2018 | Kim |
| 2018/0261260 A1 | 9/2018 | Hirashima et al. |
| 2018/0366166 A1 | 12/2018 | Nobunaga et al. |

(Continued)

FOREIGN PATENT DOCUMENTS

| | | |
|---|---|---|
| CN | 1327552 A | 12/2001 |
| CN | 101149964 A | 3/2008 |
| CN | 107274922 A | 10/2017 |

(Continued)

*Primary Examiner* — Han Yang
(74) *Attorney, Agent, or Firm* — Kim & Stewart LLP

(57) ABSTRACT

A semiconductor storage device includes a first input driver configured to receive a first signal from a memory controller, a second input driver configured to receive a chip enable signal from the memory controller, and a first control circuit. The first control circuit is configured to set the semiconductor storage device in an enabled state or a disabled state depending on whether or not the first signal which is received during a time period that starts with assertion of the chip enable signal and is prior to receipt of a command sequence, corresponds to a first chip address.

20 Claims, 17 Drawing Sheets

(56) References Cited

U.S. PATENT DOCUMENTS

2019/0146715 A1   5/2019  Sugahara et al.
2020/0089630 A1*  3/2020  Yamamoto ............. G11C 16/30

FOREIGN PATENT DOCUMENTS

| CN | 107767899 A | 3/2018 |
| CN | 108573727 A | 9/2018 |
| CN | 109416924 A | 3/2019 |
| JP | 6545786 B2  | 7/2019 |

* cited by examiner

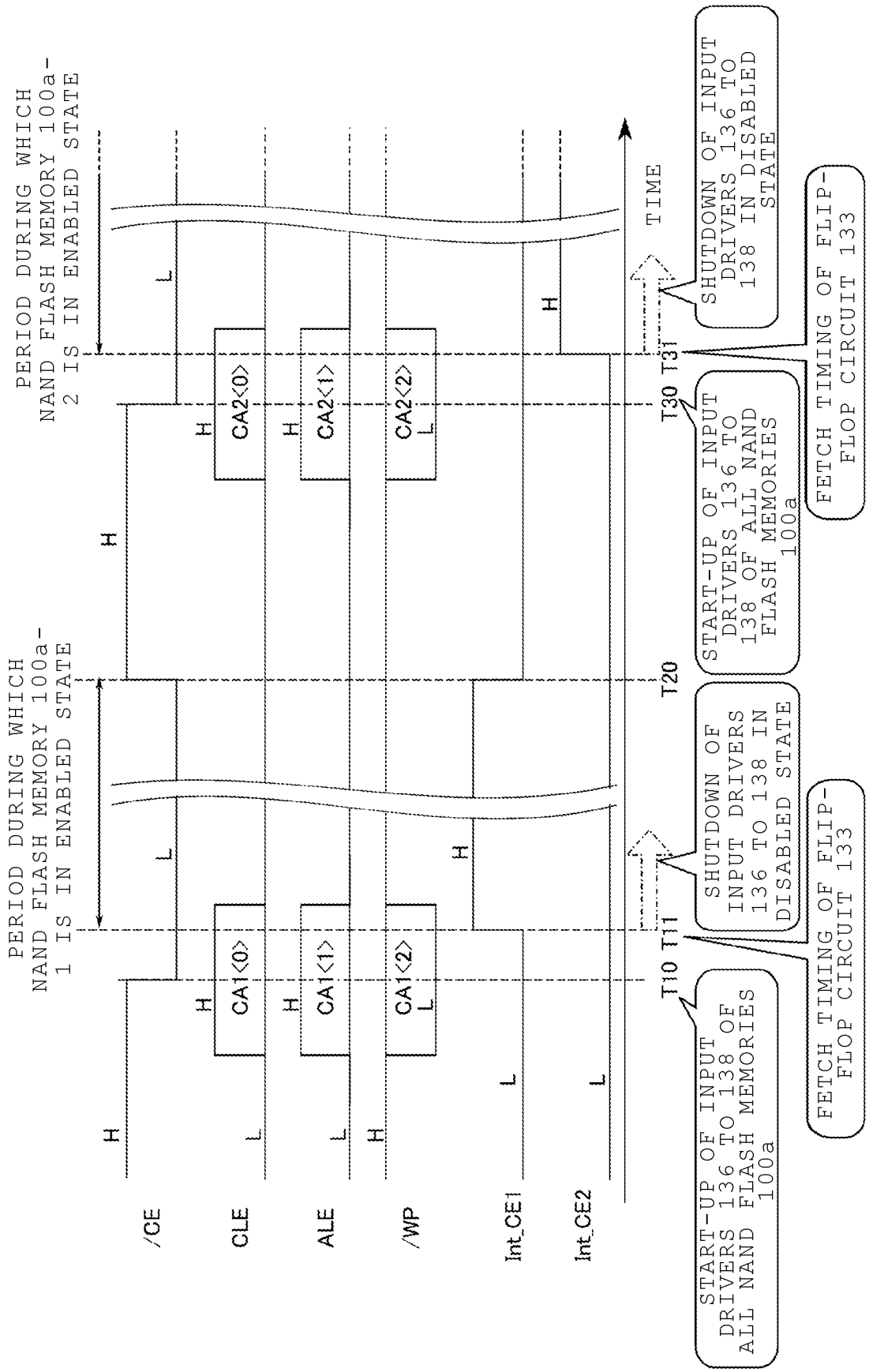

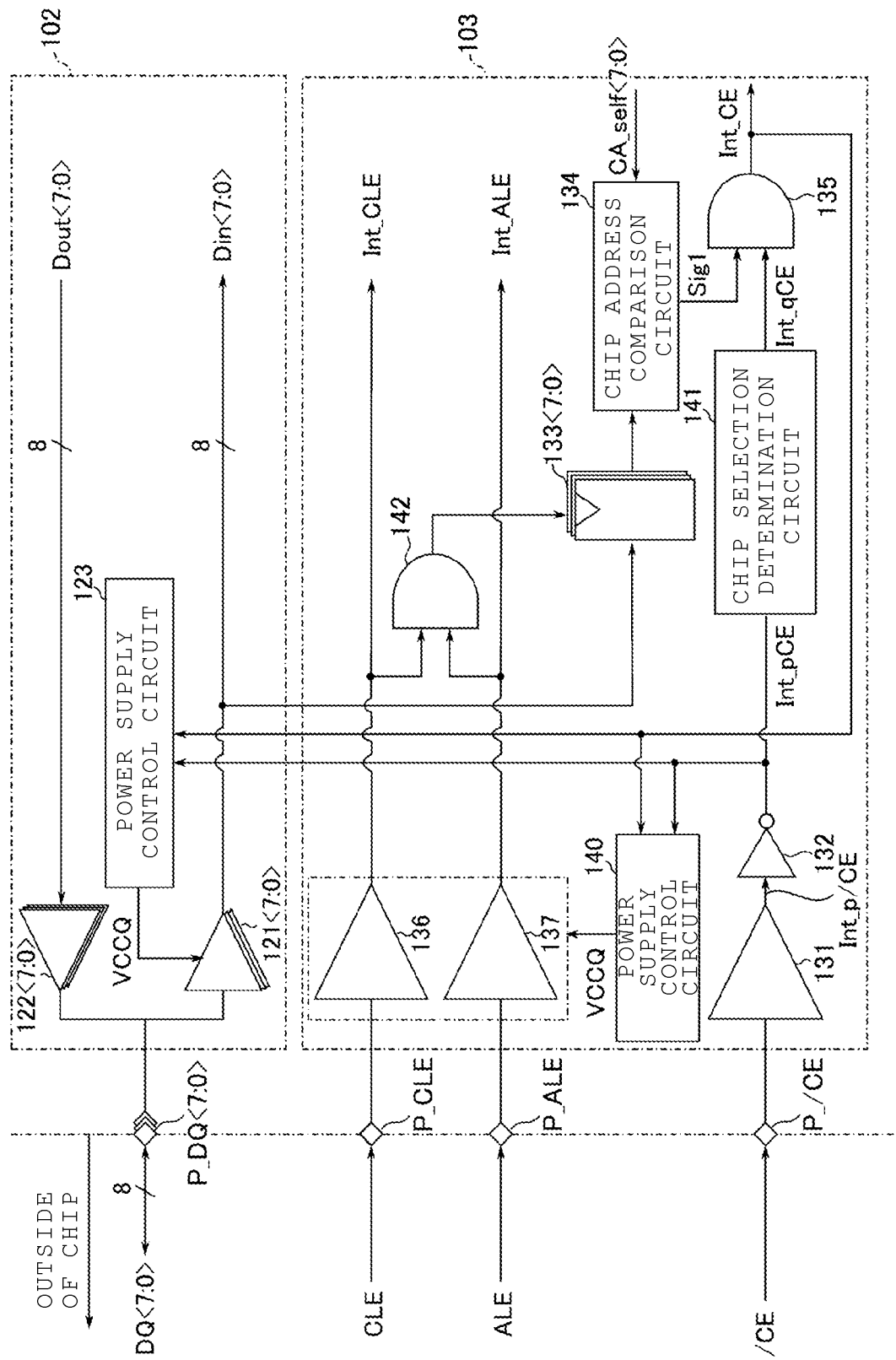

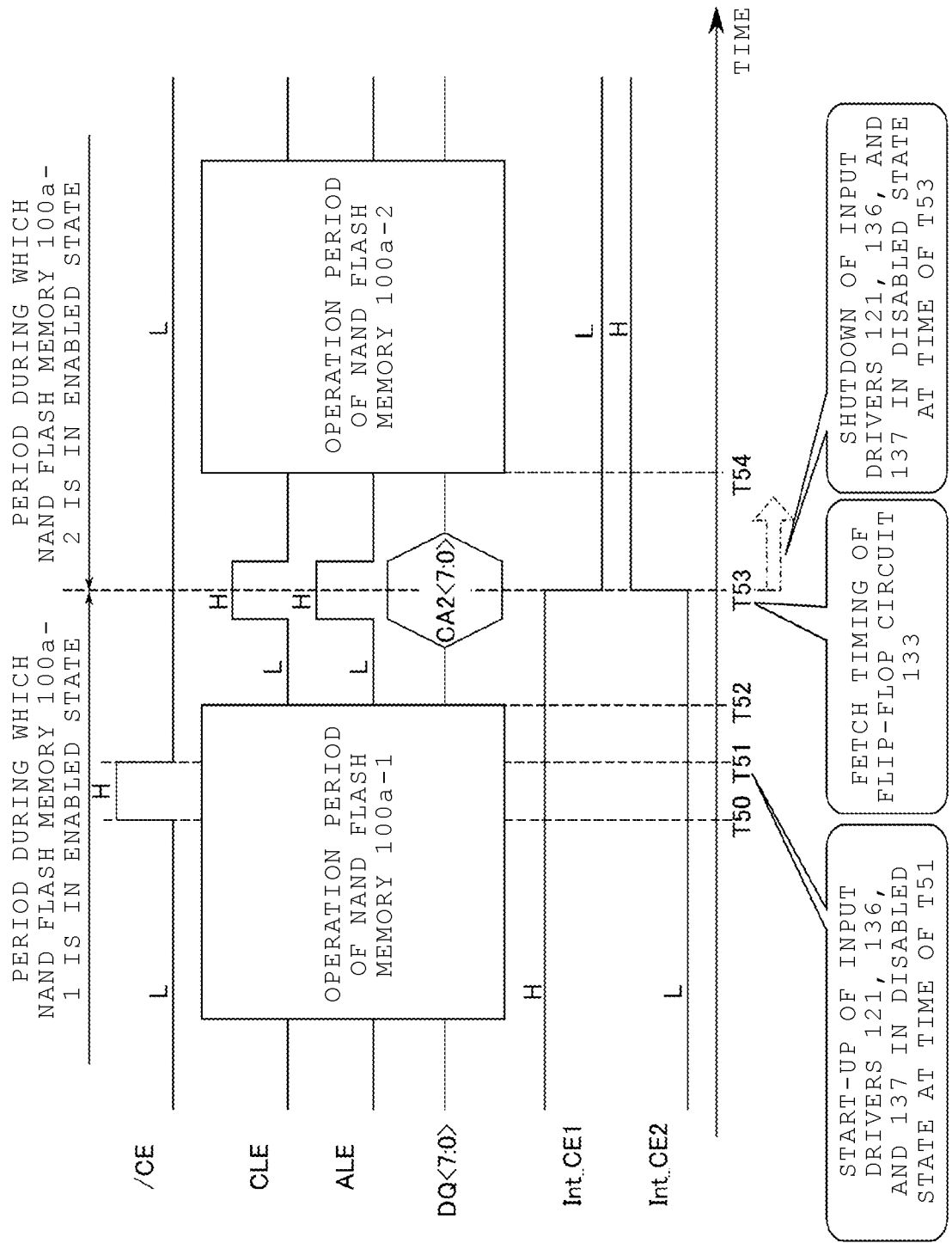

SEMICONDUCTOR STORAGE DEVICE

CROSS-REFERENCE TO RELATED APPLICATION

This application is a continuation of U.S. patent application Ser. No. 17/010,569, filed on Sep. 2, 2020, which based upon and claims the benefit of priority from Japanese Patent Application No. 2020-051634, filed Mar. 23, 2020, the entire contents of which are incorporated herein by reference.

FIELD

Embodiments described herein relate generally to a semiconductor storage device.

BACKGROUND

A NAND-type flash memory is known as one type of semiconductor storage device capable of storing data in a nonvolatile manner.

BRIEF DESCRIPTION OF THE DRAWINGS

FIG. 15 is a timing chart illustrating a chip selection operation in a memory system according to the modification of the second embodiment.

FIG. 16 is a block diagram illustrating a configuration of an input and output circuit and a logic control circuit according to a third embodiment.

FIG. 17 is a timing chart illustrating a chip selection operation in a memory system according to the third embodiment.

DETAILED DESCRIPTION

Embodiments simplify chip selection.

In general, according to one embodiment, a semiconductor storage device includes a first input driver configured to receive a first signal from a memory controller, a second input driver configured to receive a chip enable signal from the memory controller, and a first control circuit. The first control circuit is configured to set the semiconductor storage device in an enabled state or a disabled state depending on whether or not the first signal which is received during a time period that starts with assertion of the chip enable signal and is prior to receipt of a command sequence, corresponds to a first chip address.

Hereinafter, embodiments will be described with reference to the drawings. In the following description, components having the same function and configuration will be denoted by common reference signs. When distinguishing a plurality of components having the common reference signs, a suffix is added to the common reference signs to distinguish the plurality of components. When it is not required to distinguish the plurality of components, the plurality of components will be denoted only by the common reference signs, and no suffix is added thereto. When the component corresponds to a bit string of X bits, <X-1:0> is added to the reference sign of the component. When the component corresponds to the Y-th bit of the bit string of the X bits, <Y-1> is added to the reference sign of the component ($1 \leq Y \leq X$).

1. First Embodiment

A first embodiment will be described. Hereinafter, a NAND flash memory as a nonvolatile memory and a memory system including the NAND flash memory will be described as an example.

1.1 Configuration

A configuration of the memory system according to the first embodiment will be described.

1.1.1 Memory System

First, an outline of the configuration including the memory system according to the first embodiment will be described with reference to FIG. 1.

Figure 1:
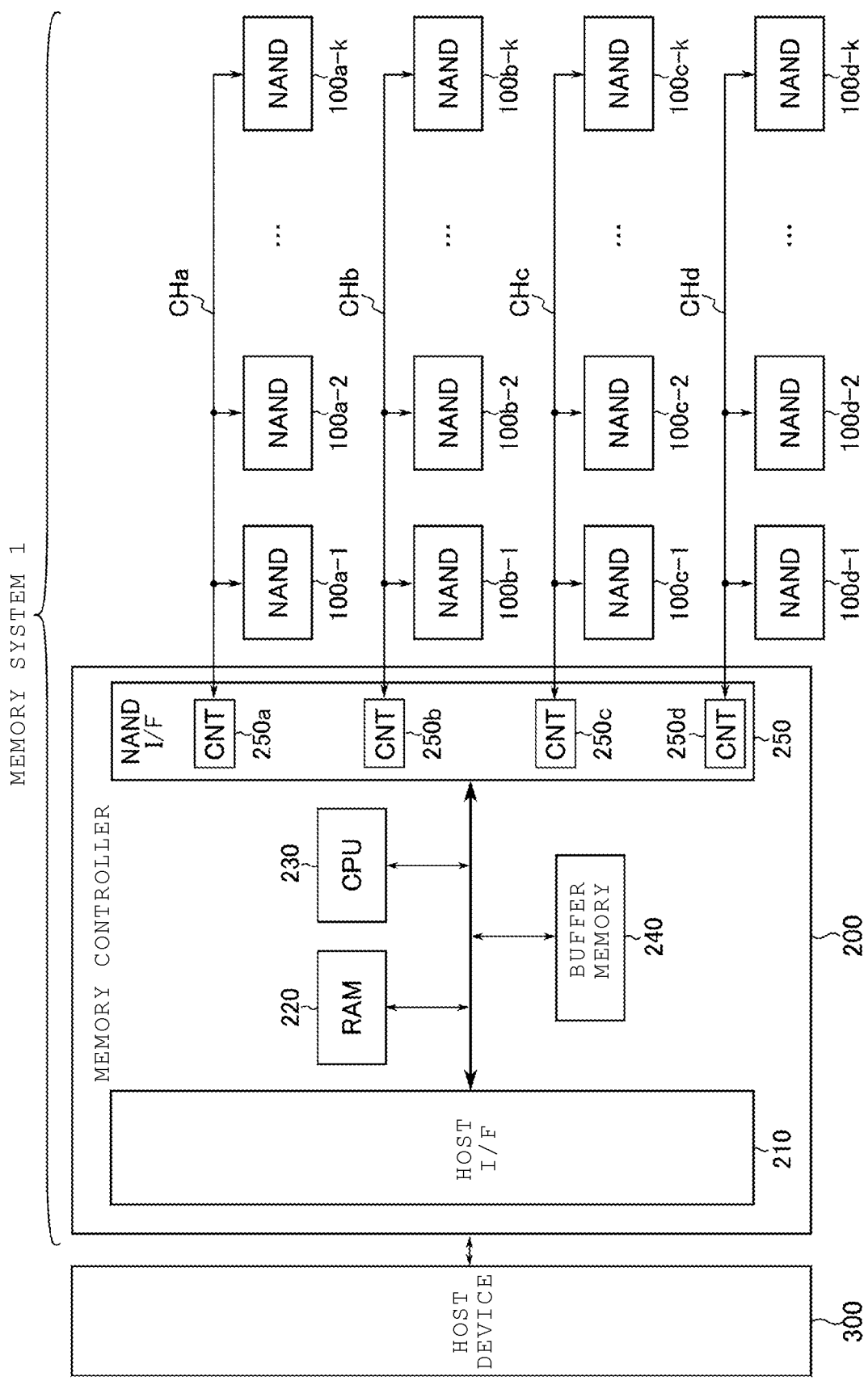
FIG. 1 is a block diagram illustrating a configuration of a memory system according to a first embodiment.

As illustrated in FIG. 1, a memory system 1 includes: a plurality of NAND flash memories (described as "NAND" in FIG. 1) 100 (100a-1, 100a-2, . . . , 100a-k, 100b-1, 100b-2, . . . , 100b-k, 100c-1, 100c-2, . . . , 100c-k, 100d-1, 100d-2, . . . , and 100d-k); and a memory controller 200 (k is an integer of 2 or more). Each of the NAND flash memories (e.g., memory chips) 100 may function as a semiconductor storage device. Alternatively, a group of NAND flash memories (e.g., a group of memory chips) 100 which are commonly connected together may function as a semiconductor storage device. The plurality of NAND flash memories 100 and the memory controller 200 may form one memory system by, for example, the combination thereof, and a memory card such as an SD™ card and a solid state drive (SSD) are exemplified. The memory system 1 is also applicable to a database or a big data processing system that uses the plurality of NAND flash memories 100 as a storage medium. In the following description, any one of the plurality of NAND flash memories 100 is also referred to as a "NAND flash memory 100". Any one of the plurality of NAND flash memories 100 to be commonly connected via a NAND flash memory bus of a channel CHa is also referred to as a "NAND flash memory 100a".

The NAND flash memory 100 includes a plurality of memory cells and is a nonvolatile memory for storing data in a nonvolatile manner. The memory controller 200 is connected to the NAND flash memory 100 via the NAND bus, and is connected to a host device 300 via a host bus. Next, the memory controller 200 controls the NAND flash memory 100 and accesses the NAND flash memory 100 in response to a command received from the host device 300.

The host device 300 is, for example, a digital camera or a personal computer, and the host bus is a bus in conformity to, for example, an SD™ interface, a serial attached SCSI (small computer system interface) (SAS), a serial ATA (advanced technology attachment) (SATA), or a peripheral component interconnect express (PCIe).

The NAND bus is a bus in conformity to, for example, a single data rate (SDR) interface or a toggle double data rate (DDR) interface.

1.1.2 Memory Controller

Next, details of a configuration of the memory controller 200 will be described with reference to FIG. 1.

The memory controller 200 is, for example, a system on a chip (SoC), and includes a host interface circuit 210, a random access memory (RAM) 220, a central processing unit (CPU) 230, a buffer memory 240, and a NAND interface circuit 250. The functions of the respective units 210 to 250 of the memory controller 200 described hereinbelow may be implemented by either a hardware configuration or a combination of hardware and firmware.

The host interface circuit 210 is connected to the host device 300 via the host bus, and transfers a command and data received from the host device 300 to the CPU 230 and the buffer memory 240, respectively. In response to the command from the CPU 230, the data in the buffer memory 240 are transferred to the host device 300.

The RAM 220 is, for example, a semiconductor memory such as a DRAM and is used as a work area of the CPU 230. The RAM 220 stores firmware for managing the NAND flash memory 100 and various management tables.

The CPU 230 controls the operation of the entire memory controller 200. For example, when receiving a write command from the host device 300, the CPU 230 issues the write command to the NAND interface circuit 250 in response thereto. The same also applies to a read operation and an erase operation. The CPU 230 also executes various operations for managing the NAND flash memory 100.

The buffer memory 240 temporarily stores write data and read data.

The NAND interface circuit 250 is connected to the NAND flash memory 100 via the NAND bus, and controls communication with the NAND flash memory 100. Next, based upon the command received from the CPU 230, various signals are outputted to the NAND flash memory 100. During a write operation, the write command issued by the CPU 230 and the write data in the buffer memory 240 are transferred to the NAND flash memory 100 as an input signal. During the read operation, a read command issued by the CPU 230 is transferred to the NAND flash memory 100 as an input signal to the NAND flash memory 100, the data read from the NAND flash memory 100 are received as an output signal from NAND flash memory 100, and the output signal is transferred to the buffer memory 240.

More specifically, the NAND interface circuit 250 includes a plurality of NAND controllers (described as "CNT" in FIGS. 1) 250a, 250b, 250c, and 250d. The NAND controllers 250a, 250b, 250c, and 250d are each associated with a unique set of the NAND flash memories 100, and responsible for transmitting and receiving data to and from the associated set of the NAND flash memories 100. In the example of FIG. 1, the NAND controller 250a is commonly connected to a plurality of NAND flash memories 100a-1, 100a-2, . . . , and 100a-k via a NAND bus of a channel CHa. The NAND controller 250b is commonly connected to a plurality of NAND flash memories 100b-1, 100b-2, . . . , and 100b-k via a NAND bus of a channel CHb. The NAND controller 250c is commonly connected to a plurality of NAND flash memories 100c-1, 100c-2, . . . , and 100c-k via a NAND bus of a channel CHc. The NAND controller 250d is commonly connected to a plurality of NAND flash memories 100d-1, 100d-2, . . . , and 100d-k via a NAND bus of a channel CHd.

1.1.3 NAND Flash Memory

Figure 2:
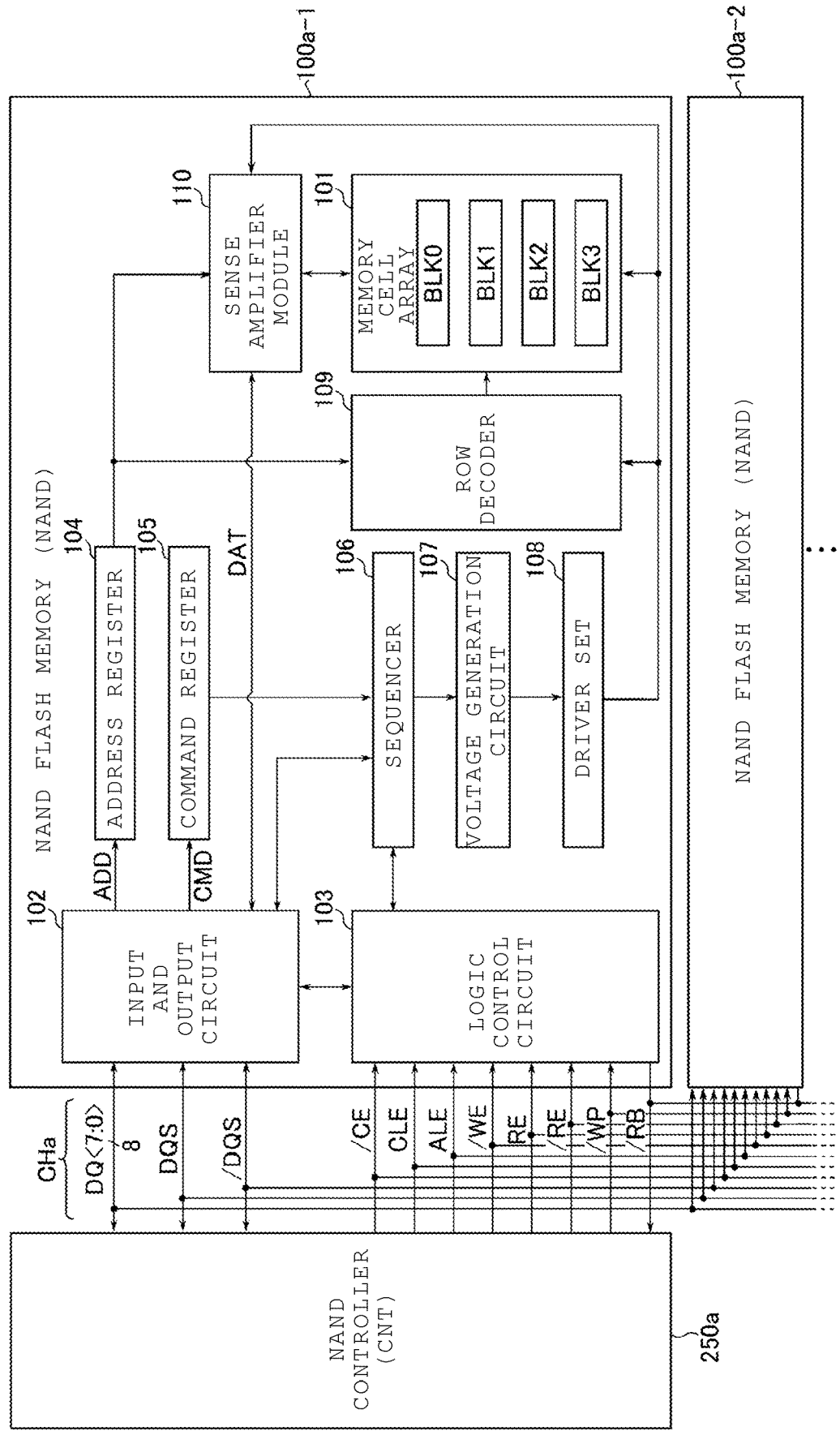
FIG. 2 is a block diagram illustrating a configuration of a NAND controller and a NAND flash memory according to the first embodiment.

Next, a configuration of the NAND flash memory 100 will be described with reference to FIGS. 2, 3, and 4. In FIG. 2, a connection relationship between the NAND controller 250a and the plurality of NAND flash memories 100a-1 to 100a-k commonly connected thereto via the NAND flash memory bus of the channel CHa is shown as an example. The NAND controller 25-b and the plurality of NAND flash memories 100b-1 to 100b-k, the NAND controller 250c and the plurality of NAND flash memories 100c-1 to 100c-k, and the NAND controller 250d and the plurality of NAND flash memories 100d-1 to 100d-k also have the same connection relationship. The configuration of the NAND flash memory 100a-1 is shown as an example in FIG. 2, and other NAND flash memories 100a-2 to 100a-k, 100b-1 to 100b-k, 100c-1 to 100c-k, and 100d-1 to 100d-k also have the same configuration as that of the NAND flash memory 100a-1.

As illustrated in FIG. 2, the NAND flash memory 100 includes a memory cell array 101, an input and output circuit 102, a logic control circuit 103, an address register 104, a command register 105, a sequencer 106, a voltage generation circuit 107, a driver set 108, a row decoder 109, and a sense amplifier module 110. All of the components of the NAND flash memory 100 may be formed in one chip. The NAND flash memory 100 may also be configured in such a manner that the respective components are formed separately in a plurality of chips, and the components are connected to each other. Alternatively, the NAND flash memory 100 may be configured in such a manner that the memory cell array 101 is formed in one chip, and other components are formed in another chip, and the two chips are connected to each other.

The memory cell array 101 includes a plurality of blocks BLK, each of which includes a plurality of nonvolatile memory cell transistors, each of which is associated with a bit line and a word line. The block BLK is, for example, a unit of erasing data. In FIG. 2, four blocks BLK0 to BLK3 are illustrated as an example. The memory cell array 101 may store in advance, for example, a chip address CA_self (not illustrated) that uniquely identifies its own NAND flash memory 100 (the NAND flash memory 100a-1 in the example of FIG. 2). The chip address CA_self may be, for example, 8 bits in length.

The input and output circuit 102 includes, for example, an input and output pad P_DQ<7:0> (not shown) by which it transmits to and receives from the NAND controller 250a an 8-bit input and output signal DQ<7:0>, and strobe signal pads P_DQS and P_/DQS (not shown) by which it transmits to and receives from the NAND controller 250a signals DQS and /DQS. The input and output signal DQ<7:0> includes data DAT, an address ADD, and a command CMD. The signal DQS is a strobe signal. The signal /DQS is an inverted signal of the signal DQS. The input and output circuit 102 respectively transfers the address ADD and the command CMD in the signal DQ<7:0> to the address register 104 and the command register 105. The input and output circuit 102 transmits and receives write data and read data DAT to and from the sense amplifier module 110.

The logic control circuit 103 includes control pads P_/CE, P_CLE, P_ALE, P_/WE, P_RE, P_/RE, and P_/WP (all not shown), by which it receives signals /CE, CLE, ALE, /WE, RE, /RE, and /WP from the memory controller 200. The logic control circuit 103 includes a status notification pad P_/RB (not shown) by which it transfers signal /RB to the memory controller 200 to notify the state of the NAND flash memory 100 to the memory controller 200.

The signal /CE is a signal for setting the NAND flash memory 100 to an enabled state, and is asserted by switching to a "L (Low)" state. The NAND flash memory 100 in the enabled state is configured to recognize that, for example, other signals CLE, ALE, /WE, RE, /RE, /WP, DQ<7:0>, DQS, and /DQS are directed thereto, to fetch these signals, and to transmit the signal /RB to the memory controller 200.

The signal /CE is negated by switching to an "H" state, and sets the NAND flash memory 100 to a disabled state. The disabled state includes, for example, a power saving (standby) mode, in which a function of a portion of the NAND flash memory 100 may be powered down. That is, the NAND flash memory 100 in the disabled state is configured to recognize that, for example, the above-described other signals CLE, ALE, /WE, RE, /RE, /WP, DQ<7:0>, DQS, and /DQS are not directed thereto, and to not fetch these signals, and stop the transmission of the signal /RB.

In the following description, among the plurality of NAND flash memories 100a-1 to 100a-k connected to the same NAND controller 250a, an operation of selecting which NAND flash memory 100a to enable is referred to as a "chip selection operation".

The signals CLE and ALE are signals that notify the NAND flash memory 100 that the input signals DQ<7:0> to the NAND flash memory 100 are a command and an address, respectively. Specifically, for example, when the signals CLE and ALE are respectively in the "H (High)" state and the "L" state, the signals CLE and ALE notify the NAND flash memory 100 that the input signal DQ<7:0> is the command CMD, and when the signals CLE and ALE are respectively in the "L" state and the "H" state, the signals CLE and ALE notify the NAND flash memory 100 that the input signal DQ<7:0> is the address ADD. When both the signals CLE and ALE are in the "L" state, the signals CLE and ALE notify the NAND flash memory 100 that the input signal DQ<7:0> is the data DAT.

The signal /WE is a signal that is asserted in the "L" state and causes the input signal DQ<7:0> to be fetched by the NAND flash memory 100. The signal /RE is a signal that is asserted in the "L" state and causes the NAND flash memory 100 to transmit the output signal DQ<7:0>. The signal RE is an inverted signal of the signal/RE. The signal/WP is a signal that is asserted in the "L" state to prohibit writing in the NAND flash memory 100.

The signal /RB is a signal indicating whether the NAND flash memory 100 is in a ready state (that is, the NAND flash memory 100 can receive the command from the memory controller 200) or a busy state (a state in which the command from the memory controller 200 cannot be received), and the "L" state indicates the busy state. When the signal /RB is in the busy state, the NAND flash memory 100 in the enabled state does not switch to the standby mode even though the signal /CE is negated.

The communication of each of the various signals DQ<7:0>, DQS, /DQS, /CE, CLE, ALE, /WE, RE, /RE, /WP, and /RB described above between the NAND controller 250a and the NAND flash memories 100a-1 to 100a-k is carried out using a common signal line.

The address register 104 stores the address ADD received from the memory controller 200 via the input and output circuit 102. This address ADD includes a block address BA and a page address PA. The command register 105 stores the command CMD received from the memory controller 200 via the input and output circuit 102.

The sequencer 106 controls an operation of the entire NAND flash memory 100 based upon the command CMD stored in the command register 105.

The voltage generation circuit 107 generates a voltage used in a read operation, a write operation, and an erasing operation. The driver set 108 supplies the voltage generated by the voltage generation circuit 107 to the memory cell array 101, the row decoder 109, and the sense amplifier module 110.

The row decoder 109 selects any one of the blocks BLK0 to BLK3 based upon the block address BA in the address register 104, and further selects a word line in the selected block BLK.

The sense amplifier module 110 transfers the write data DAT received from the memory controller 200 to the memory cell array 101 in the write operation of the data. In the read operation of the data, the sense amplifier module 110 senses a threshold voltage of the memory cell transistor in the memory cell array 101, and reads the read data DAT based upon the sense result.

Figure 3:
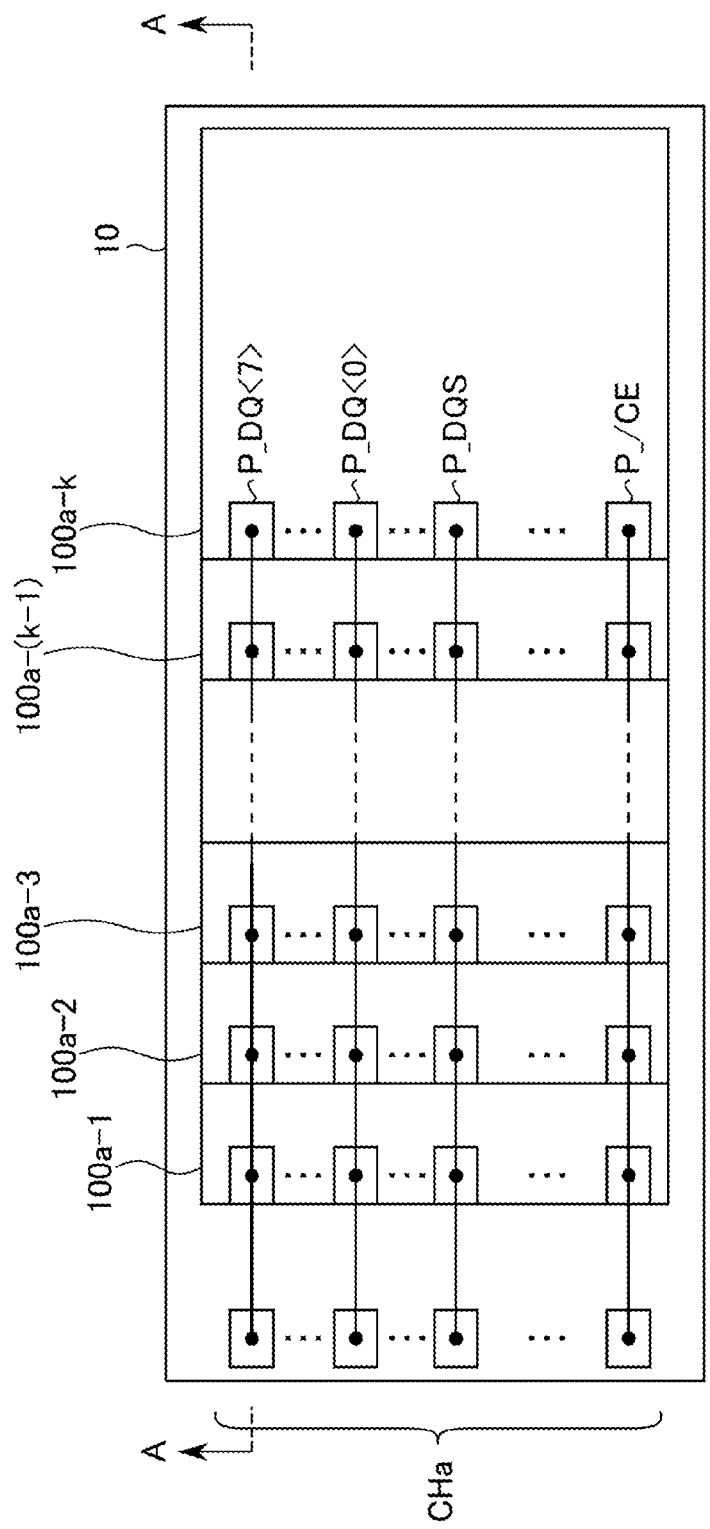
FIG. 3 is a plan view illustrating the configuration of the NAND flash memory according to the first embodiment.
Figure 4:
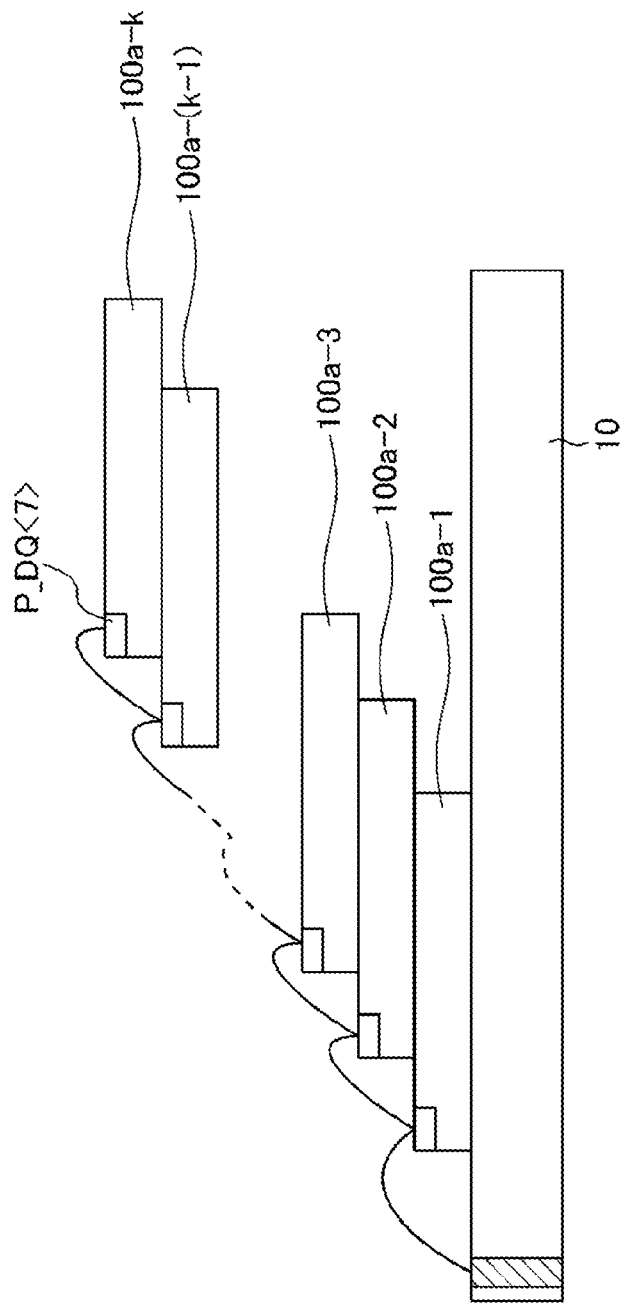
FIG. 4 is a cross-sectional view illustrating the configuration of the NAND flash memory according to the first embodiment.

FIG. 3 is a diagram illustrating a connection relationship of the plurality of NAND flash memories 100a-1, 100a-2, . . . , and 100a-k commonly connected via the NAND bus of the channel Cha, and FIG. 4 is a cross-sectional view corresponding to the line A-A of FIG. 3.

As illustrated in FIGS. 3 and 4, for example, the plurality of NAND flash memories 100a-1, 100a-2, . . . , and 100a-k are stacked on a substrate 10 in order to reduce a size of a package. The stacked NAND flash memories 100a-1, 100a-2, and 100a-k are connected to each other by a bonding wire or a through electrode.

For example, when connected to each other by the bonding wire, as illustrated in FIGS. 3 and 4, the respective NAND flash memories 100a are stacked in a state of being shifted from each other so that the input and output pad P_DQ<7:0>, the strobe signal pads P_DQS and P_/DQS, the control pads P_/CE, P_CLE, P_ALE, P_/WE, P_RE, P_/RE, and P_/WP, and the status notification pad P_/RB are respectively exposed. Then, corresponding pads of the respective NAND flash memories 100a are commonly connected.

As described above, in the embodiment, the plurality of NAND flash memories 100a share the wiring for inputting and outputting each signal. Therefore, in the embodiment, the NAND controller 250a cannot individually set the plurality of NAND flash memories 100a to the enabled state or the disabled state by using the signal /CE only.

1.1.4 Memory Cell Array

Figure 5:
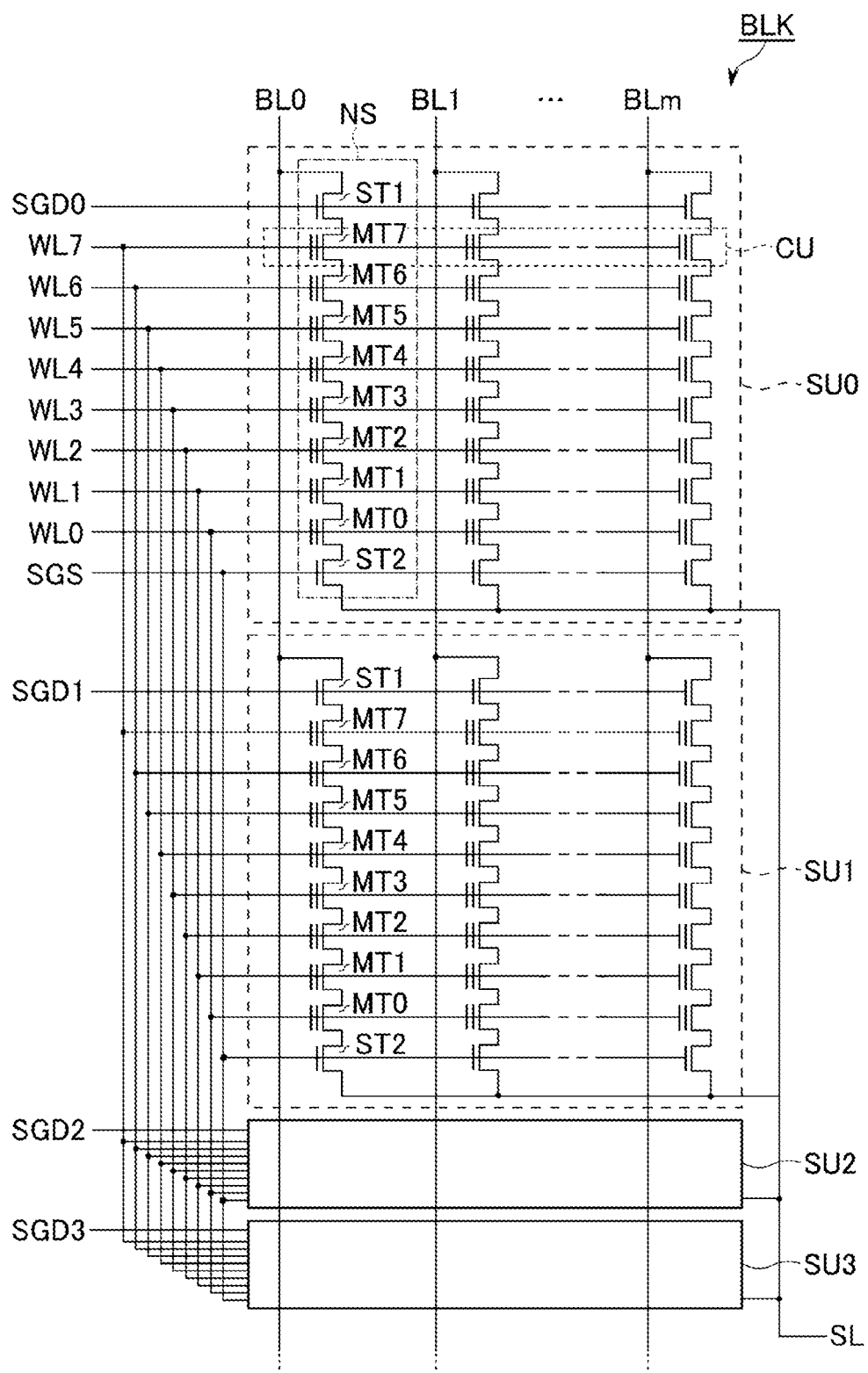
FIG. 5 is a circuit diagram illustrating a configuration of a memory cell array according to the first embodiment.

FIG. 5 is a circuit diagram illustrating a configuration of the memory cell array according to the first embodiment. In FIG. 5, one block BLK among the plurality of blocks BLK in the memory cell array 101 is illustrated.

As illustrated in FIG. 5, the block BLK includes, for example, four string units SU (SU0 to SU3). Each string unit SU includes a plurality of NAND strings NS respectively associated with bit lines BL0 to BLm (m is an integer of 1 or more). Each NAND string NS includes, for example, eight memory cell transistors MT0 to MT7 and select transistors ST1 and ST2. The memory cell transistor MT includes a control gate and a charge storage layer, and stores charges (electrons) corresponding to the data in a nonvolatile manner. Each of the select transistors ST1 and ST2 is used to select the string unit SU during various operations.

In each NAND string NS, the memory cell transistors MT0 to MT7 are connected in series. A drain of the select transistor ST1 is connected to the associated bit line BL, and a source of the select transistor ST1 is connected to one end of the memory cell transistors MT0 to MT7 connected in series. A drain of the select transistor ST2 is connected to the other end of the memory cell transistors MT0 to MT7 connected in series. A source of the select transistor ST2 is connected to a source line SL.

In the same block BLK, the control gates of the memory cell transistors MT0 to MT7 are commonly connected to word lines WL0 to WL7, respectively. The gates of the select transistors ST1 in the string units SU0 to SU3 are commonly connected to select gate lines SGD0 to SGD3, respectively. A gate of the select transistor ST2 is commonly connected to a select gate line SGS.

That is, the block BLK is a group of a plurality of string units SU sharing the same word lines WL0 to WL7. The block BLK is, for example, a data erasing unit. That is, the data to be stored in the memory cell transistor MT in the same block BLK are collectively erased.

The string unit SU is a group of a plurality of NAND strings NS, each of which is connected to a different bit line BL and to the same select gate line SGD. Among the string units SU, a group of the memory cell transistors MT commonly connected to the same word line WL is also referred to as a cell unit CU. For example, a group of bits (if each memory cell transistor MT is capable of storing a plurality of bits, a group of corresponding bits) stored in the plurality of memory cell transistors MT in the cell unit CU is defined as "one page". The cell unit CU may have a storage capacity of two page data or more in accordance with the number of bits of the data stored in the memory cell transistor MT.

The circuit configuration of the memory cell array 101 described above is not limited to the configuration described above. For example, the number of memory cell transistors MT and select transistors ST1 and ST2 in each NAND string NS may be respectively designed to be any number. The number of string units SU in each block BLK also may be designed to be any number.

1.1.5 Input and Output Circuit and Logic Control Circuit

Figure 6:
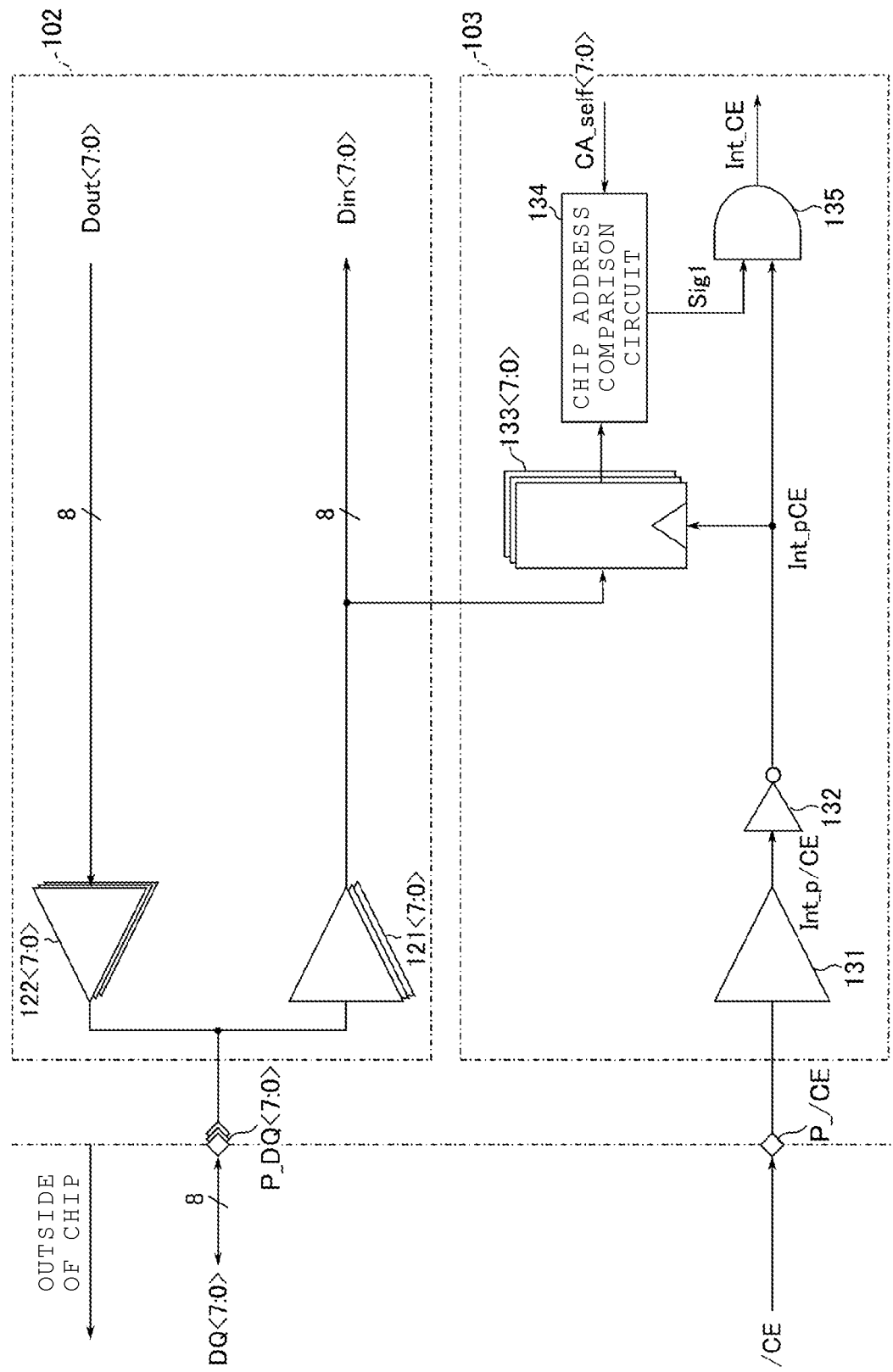
FIG. 6 is a block diagram illustrating a configuration of an input and output circuit and a logic control circuit according to the first embodiment.

Next, configurations of the input and output circuit 102 and the logic control circuit 103 according to the first embodiment will be described with reference to a block diagram illustrated in FIG. 6. In FIG. 6, a configuration of the NAND flash memory 100a is illustrated as an example, and other NAND flash memories 100b to 100d also have the same configuration.

As illustrated in FIG. 6, the input and output circuit 102 includes an input driver 121 (which is provided per bit and labeled as 121<7:0> in FIGS. 6, 12, and 16) and an output driver 122 (which is provided per bit and labeled as 122<7:0> in FIG. 6). The logic control circuit 103 includes an input driver 131, an inverter 132, a flip-flop circuit 133 (which is provided per bit and labeled as 133<7:0> in FIGS. 6, 12, and 16), a chip address comparison circuit 134, and an AND circuit 135.

For example, the same type of signal DQ<i> is assigned to one set including the input driver 121<i> and the output driver 122<i> (0≤i≤7). That is, the set including the input driver 121<i> and the output driver 122<i> is configured to be able to cause the signal DQ<i> to communicate with the memory controller 200 via an input and output pad P_DQ<i>. When receiving the signal DQ<7:0>, the input driver 121 amplifies the signal DQ<7:0> to generate a signal Din<7:0>, and outputs the generated signal Din<7:0> from an output terminal to the inside of the NAND flash memory 100. When receiving a signal Dout<7:0> from the inside of the NAND flash memory 100, the output driver 122 amplifies the signal Dout<7:0> to generate the signal DQ<7:0>, and outputs the generated signal DQ<7:0> to the memory controller 200.

The signal /CE is assigned to the input driver 131. That is, the input driver 131 is configured to be able to receive the signal /CE via the memory controller 200 and the control pad P_/CE. When receiving the signal /CE, the input driver 131 amplifies the signal /CE to generate a signal Int_p/CE, and outputs the generated signal Int_p/CE from the output terminal.

The inverter 132 includes: an input terminal connected to the output terminal of the input driver 131; and an output terminal commonly connected to a control terminal of the flip-flop circuit 133 and a first input terminal of the AND circuit 135. When receiving the signal Int_p/CE from the input driver 131, the inverter 132 outputs a signal Int_pCE from the output terminal. The signal Int_pCE is an inverted signal of the signal Int_p/CE.

The flip-flop circuit 133 includes: an input terminal connected to the output terminal of the input driver 121; an output terminal connected to a first input terminal of the chip address comparison circuit 134; and the control terminal connected to the output terminal of the inverter 132. The flip-flop circuit 133 is triggered by a change of the signal Int_pCE inputted from the control terminal from the "L" state to the "H" state, latches the signal Din<7:0> for one cycle inputted from the input terminal (that is, 8-bit information), and outputs the latched signal from the output terminal. The flip-flop circuit 133 maintains the output of the latched information, for example, in a state where the signal Int_pCE maintains the "H" state, in a state where the signal Int_pCE changes from the "H" state to the "L" state, and in a state where the signal Int_pCE maintains the "L" state.

The chip address comparison circuit 134 includes: the first input terminal connected to the output terminal of the flip-flop circuit 133; a second input terminal; and an output terminal connected to a second input terminal of the AND circuit 135. For example, a chip address CA_self<7:0> set uniquely to each NAND flash memory 100 is inputted to the second input terminal of the chip address comparison circuit 134. The chip address CA_self<7:0> can be set, for example, by supplying a power supply voltage to a chip address designation pad, which is not illustrated, provided in the NAND flash memory 100. For example, the chip address CA_self<7:0> may be read from the memory cell array 101. For example, the chip address CA_self<7:0> inputted to the chip address comparison circuit 134 may be separately transmitted from the memory controller 200 prior to a series of operations. The chip address comparison circuit 134 compares bit strings of 8 bits inputted from each of the first input terminal and the second input terminal for each corresponding bit. Next, the chip address comparison circuit 134 generates a signal Sig1 in the "H" state when all the corresponding bits match each other, generates a signal Sig1 in the "L" state when at least one of the corresponding bits does not match, and outputs the signal Sig1 from the output terminal.

The AND circuit 135 includes: the first input terminal to which the signal Int_pCE is inputted; the second input terminal to which the signal Sig1 is inputted; and an output terminal from which a signal Int_CE is outputted. The AND circuit 135 generates a signal Int_CE in the "H" state when both the signals Int_pCE and Sig1 are in the "H" state, generates a signal Int_CE in the "L" state when at least one of the signals Int_pCE and Sig1 is in the "L" state, and outputs the signal Int_CE from the output terminal. The signal Int_CE is a signal indicating which NAND flash memory 100*a* is to be set to the enabled state by the signal /CE commonly inputted to the k pieces of NAND flash memories 100*a*-1 to 100*a*-k commonly connected to the same NAND controller 250*a*. Specifically, the logic control circuit 103 determines that the NAND flash memory 100*a* thereof is in the enabled state by the signal Int_CE in the "H" state, and determines that the NAND flash memory 100*a* thereof is in the disabled state by the signal Int_CE in the "L" state.

1.2 Chip Selection Operation

Figure 7:
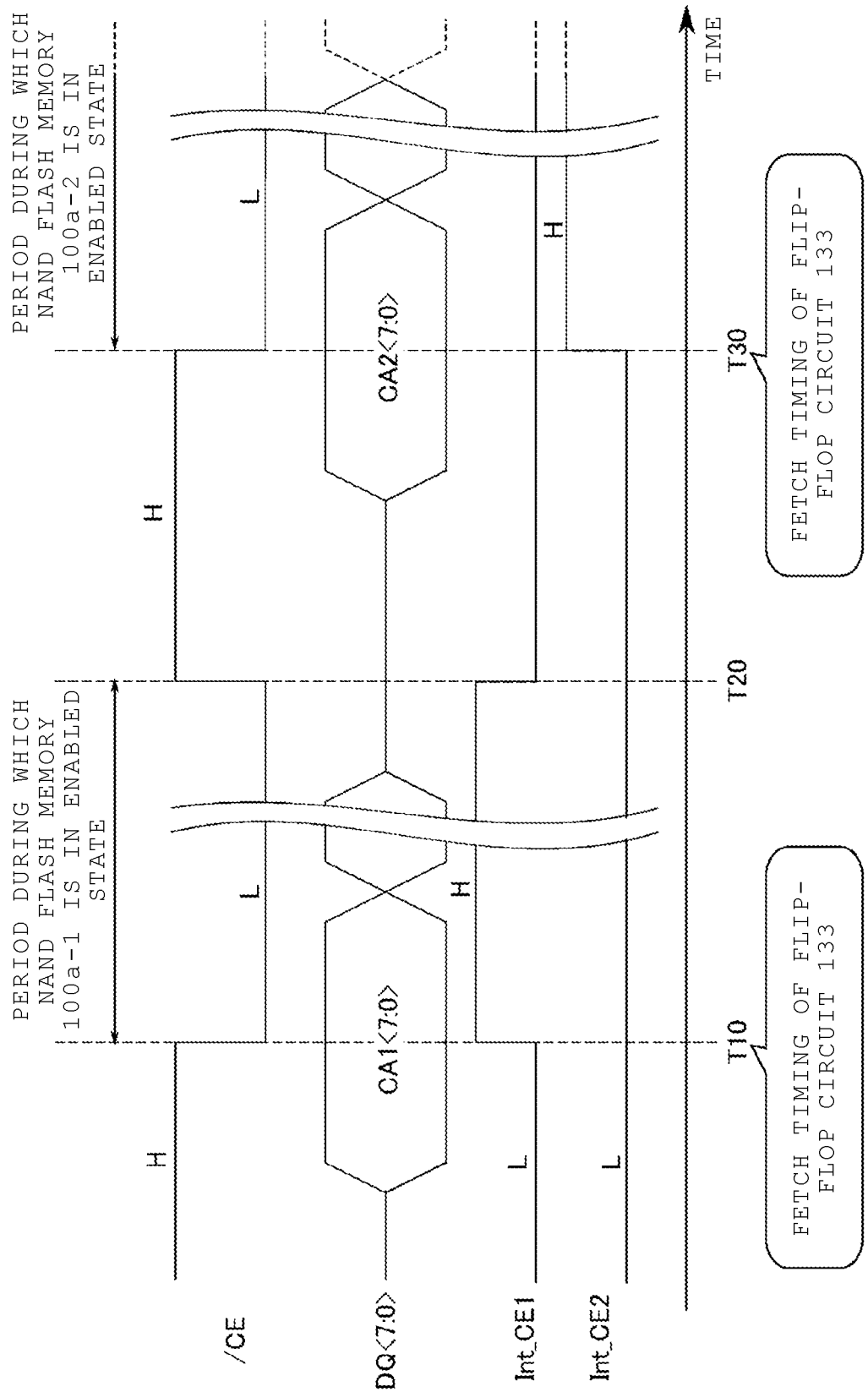
FIG. 7 is a timing chart illustrating a chip selection operation in the memory system according to the first embodiment.

Next, a chip selection operation of the memory system according to the first embodiment will be described with reference to a timing chart illustrated in FIG. 7. In the example of FIG. 7, it is shown as an example that among the NAND flash memories 100*a*-1 to 100*a*-k commonly connected to the NAND controller 250*a*, the NAND flash memories 100*a*-1 and 100*a*-2 respectively enter the enabled state in this order. In FIG. 7, the signals Int_CE in the NAND flash memories 100*a*-1 and 100*a*-2 are respectively shown as signals Int_CE1 and Int_CE2.

Hereinafter, for the convenience of description, "-1" and "-2" are respectively added to the reference signs of the elements in the NAND flash memories 100*a*-1 and 100*a*-2, such that they can be distinguished from each other.

As illustrated in FIG. 7, the signal /CE in the "H" state is supplied to input drivers 131-1 and 131-2 until reaching time T10. Accordingly, signals Int_p/CE-1 and Int_p/CE-2 outputted from the input drivers 131-1 and 131-2 enter the "H" state, and signals Int_pCE-1 and Int_pCE-2 outputted from inverters 132-1 and 132-2 enter the "L" state. Therefore, both the signals Int_CE1 and Int_CE2 enter the "L" state, and both the NAND flash memories 100*a*-1 and 100*a*-2 enter the disabled state.

At the time T10, the signal /CE is asserted from the "H" state to the "L" state. The signal DQ<7:0> for one cycle is supplied to input drivers 121-1 and 121-2 in synchronization with the assertion of the signal /CE. The input drivers 121-1 and 121-2 respectively output signals Din-1<7:0> and Din-2<7:0> based upon the signal DQ<7:0>. Both the signals Din-1<7:0> and Din-2<7:0> include, for example, a chip address CA1<7:0> that uniquely identifies the NAND flash memory 100*a*-1.

The signal /CE is asserted, whereby the signals Int_pCE-1 and Int_pCE-2 enter the "H" state. Accordingly, flip-flop circuits 133-1 and 133-2 latch the chip address CA1<7:0>.

Chip address comparison circuits 134-1 and 134-2 compare the chip address CA1<7:0> with the chip address CA_self<7:0> corresponding to itself.

Specifically, in the NAND flash memory 100*a*-1, the chip address CA_self<7:0> matches the chip address CA1<7:0>. Accordingly, the chip address comparison circuit 134-1 outputs a signal Sig1-1 in the "H" state. An AND circuit 135-1 outputs a signal Int_CE1 in the "H" state based upon a signal Int_pCE-1 in the "H" state and the signal Sig1-1 in the "H" state.

On the other hand, in the NAND flash memory 100*a*-2, the chip address CA_self<7:0> is different from the chip address CA1<7:0>. Accordingly, the chip address comparison circuit 134-2 outputs a signal Sig1-2 in the "L" state. An AND circuit 135-2 outputs the signal Int_CE2 in the "L" state based upon the signal Int_pCE-2 in the "H" state and the signal Sig1-2 in the "L" state.

Accordingly, at the time T10, the NAND flash memory 100*a*-1 enter the enabled state, and the NAND flash memory 100*a*-2 enter the disabled state.

At time T20, the signal /CE is negated from the "L" state to the "H" state. Accordingly, both the signals Int_CE1 and Int_CE2 enter the "L" state, and both the NAND flash memories 100*a*-1 and 100*a*-2 enter the disabled state.

At time T30, the signal /CE is asserted from the "H" state to the "L" state. The signal DQ<7:0> is supplied to the input drivers 121-1 and 121-2 in synchronization with the assertion of the signal /CE. The input drivers 121-1 and 121-2 respectively output the signals Din-1<7:0> and Din-2<7:0> based upon the signal DQ<7:0>. The signals Din-1<7:0> and Din-2<7:0> include, for example, the chip address CA2<7:0> that uniquely identifies the NAND flash memory 100*a*-2.

The signal /CE is asserted, whereby the signals Int_pCE-1 and Int_pCE-2 enter the "H" state. Accordingly, the flip-flop circuits 133-1 and 133-2 latch the chip address CA2<7:0>.

The chip address comparison circuits 134-1 and 134-2 compare the chip address CA2<7:0> with the chip address CA_self<7:0> corresponding to itself.

Specifically, in the NAND flash memory 100*a*-1, the chip address CA_self<7:0> is different from the chip address CA2<7:0>. Accordingly, the chip address comparison circuit 134-1 outputs the signal Sig1-1 in the "L" state. The AND circuit 135-1 outputs the signal Int_CE1 in the "L" state based upon the signal Int_pCE-1 in the "H" state and the signal Sig1-1 in the "L" state.

On the other hand, in the NAND flash memory 100*a*-2, the chip address CA_self<7:0> matches the chip address CA2<7:0>. Accordingly, the chip address comparison circuit 134-2 outputs the signal Sig1-2 in the "H" state. The AND circuit 135-2 outputs the signal Int_CE2 in the "H" state based upon the signal Int_pCE-2 in the "H" state and the signal Sig1-2 in the "H" state.

Accordingly, at the time T30, the NAND flash memory 100*a*-1 enters the disabled state, and the NAND flash memory 100*a*-2 enters the enabled state.

As described above, the signal DQ<7:0> for one cycle including the chip address CA1<7:0> is inputted in synchronization with a fact that the signal /CE is asserted from the "H" state to the "L" state at the time T10, and the signal DQ<7:0> for one cycle including the chip address CA2<7:0> is inputted in synchronization with a fact that the signal /CE is asserted from the "H" state to the "L" state at the time T30.

With respect to the timing at which the signal Int_pCE is supplied from the inverter 132 to the control terminal of the flip-flop circuit 133 based upon the assertion of the signal /CE, the period during which the signal Din<7:0> is supplied from the input driver 121 to the input terminal of the flip-flop circuit 133 based upon the input of the signal DQ<7:0> may satisfy the setup time and the hold time.

1.3 Effects of the Embodiment

According to the first embodiment, the NAND flash memories 100a-1 and 100a-2 are supplied with the same signal /CE from the memory controller 200. The flip-flop circuits 133-1 and 133-2 latch the signal DQ<7:0> in synchronization with the assertion of the signal /CE. The chip address comparison circuits 134-1 and 134-2 compare the chip address CA_self<7:0> corresponding to itself with the chip address CA<7:0> in the signal DQ<7:0>, and when the chip address CA_self<7:0> and the chip address CA<7:0> match each other, the chip address comparison circuits 134-1 and 134-2 respectively output the signals Sig1-1 and Sig1-2 in the "H" state, and when the chip address CA_self<7:0> and the chip address CA<7:0> do not match each other, the chip address comparison circuits 134-1 and 134-2 respectively output the signals Sig1-1 and Sig1-2 in the "L" state. The AND circuit 135-1 outputs the AND result of the signal Int_pCE-1, which is the inverted signal of the signal /CE, and the signal Sig1-1 as the signal Int_CE1. The AND circuit 135-2 outputs the AND result of the signal Int_pCE-2, which is the inverted signal of the signal /CE, and the signal Sig1-2 as the signal Int_CE2. Accordingly, both the NAND flash memories 100a-1 and 100a-2 can determine whether or not the NAND flash memories 100a-1 and 100a-2 themselves are instructed to enter the enabled state at the same time when the signal /CE is asserted. Therefore, the memory controller 200 is not required to designate the chip address CA by the command sequence every time the write operation and the read operation are performed. Therefore, chip selection can be simplified.

After the signal /CE is asserted, the NAND flash memory 100 in the enabled state can exclusively use the signal /CE without receiving the issue of the command sequence including the designation of the chip address. Therefore, the memory controller 200 can determine whether the NAND flash memory 100 in the enabled state is in the ready state or the busy state without executing the command sequence.

Figure 8:
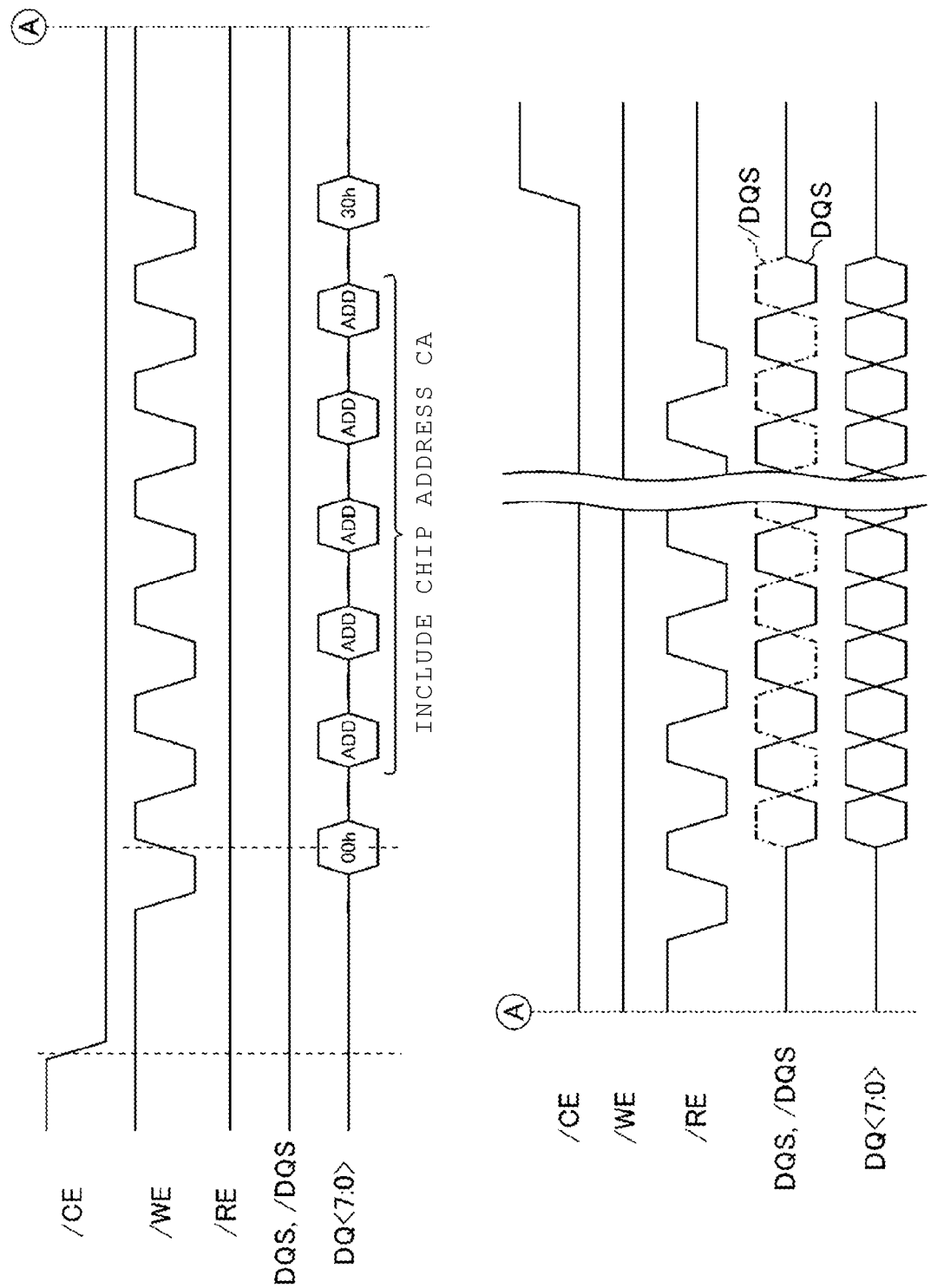
FIG. 8 is a command sequence illustrating a read operation in a memory system according to a comparative example.
Figure 9:
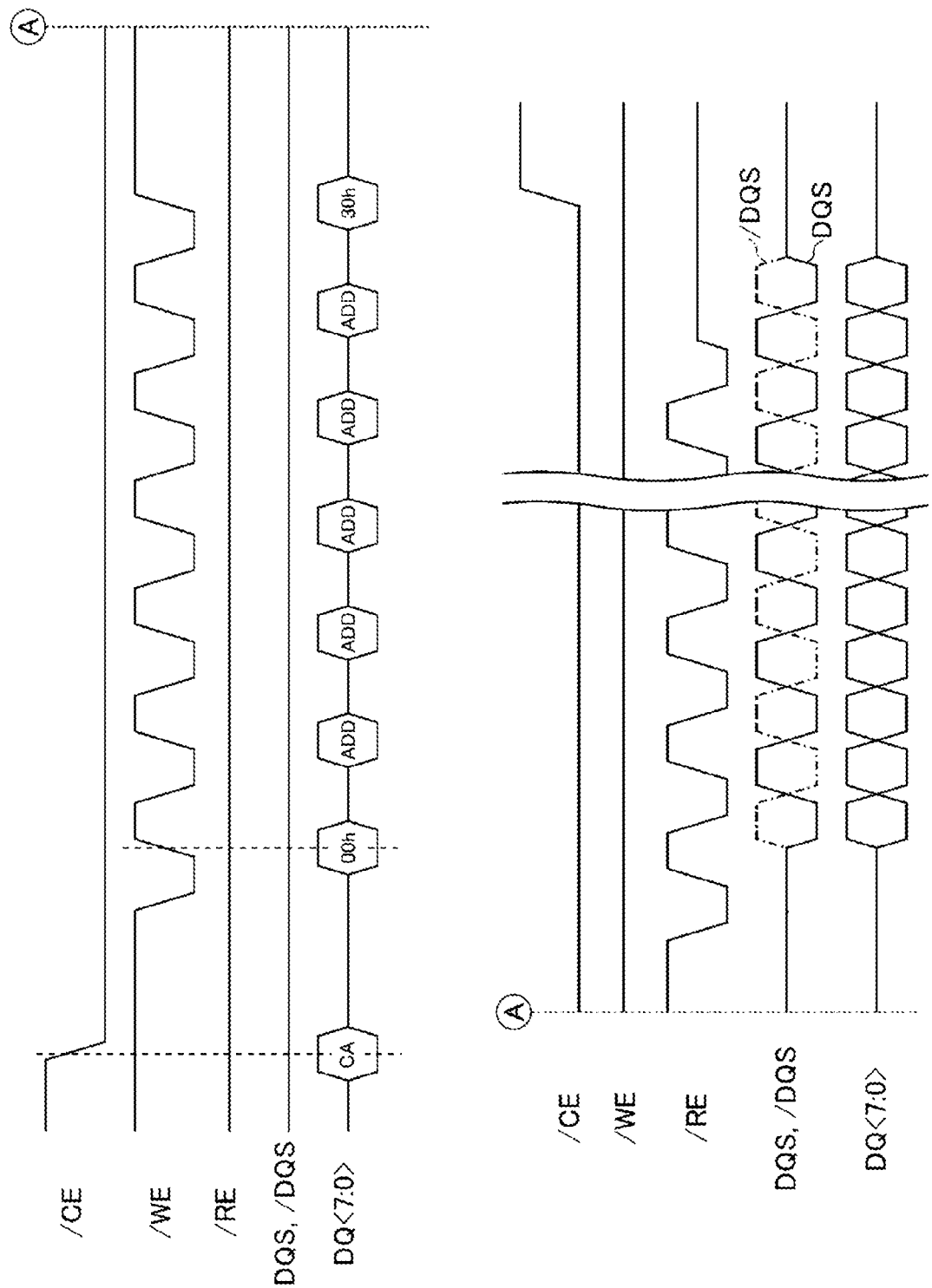
FIG. 9 is a command sequence illustrating a read operation in the memory system according to the first embodiment.

FIG. 8 is a command sequence illustrating a read operation of a NAND flash memory according to a comparative example. FIG. 9 is a command sequence illustrating a read operation of the NAND flash memory according to the first embodiment.

As illustrated in FIG. 8, in the comparative example, in order to cause the NAND flash memory 100a, which is an operation target among the plurality of NAND flash memories 100a, to execute the read operation, the NAND controller 250a sequentially issues a read command "00h", an address ADD for 5 cycles, and a command "30h" while toggling the signal /WE. The command "00h" is a command for instructing the reading of data from the memory cell array 101, and the command "30h" is a command for instructing the start of the read operation.

In the comparative example, the address ADD includes information for designating which of the plurality of NAND flash memories 100a is the operation target (for example, the chip address CA). Therefore, each of the plurality of NAND flash memories 100a cannot determine whether or not itself is instructed to enter in the enabled state until receiving the address ADD.

On the other hand, as illustrated in FIG. 9, in the first embodiment, the NAND controller 250a inputs the signal DQ<7:0> for one cycle including the chip address CA<7:0> in synchronization with the assertion of the signal /CE from the "H" state to the "L" state. Accordingly, each of the plurality of NAND flash memories 100a can determine whether or not itself is instructed to enter the enabled state at a timing earlier than receiving the address ADD in the command sequence.

1.4 Modification of the First Embodiment

The first embodiment is not limited to the above-descried example, and various modifications are applicable thereto. For example, in the above-described first embodiment, the case in which the NAND flash memory 100 receives the 8-bit chip address CA<7:0> via the signal DQ<7:0> is described, and the first embodiment is not limited thereto when the number of bits of the chip address CA is small. In the following description, the description of a configuration and an operation equivalent to those of the first embodiment will be omitted, and a configuration and an operation different from those of the first embodiment will be mainly described.

1.4.1 Logic Control Circuit

Figure 10:
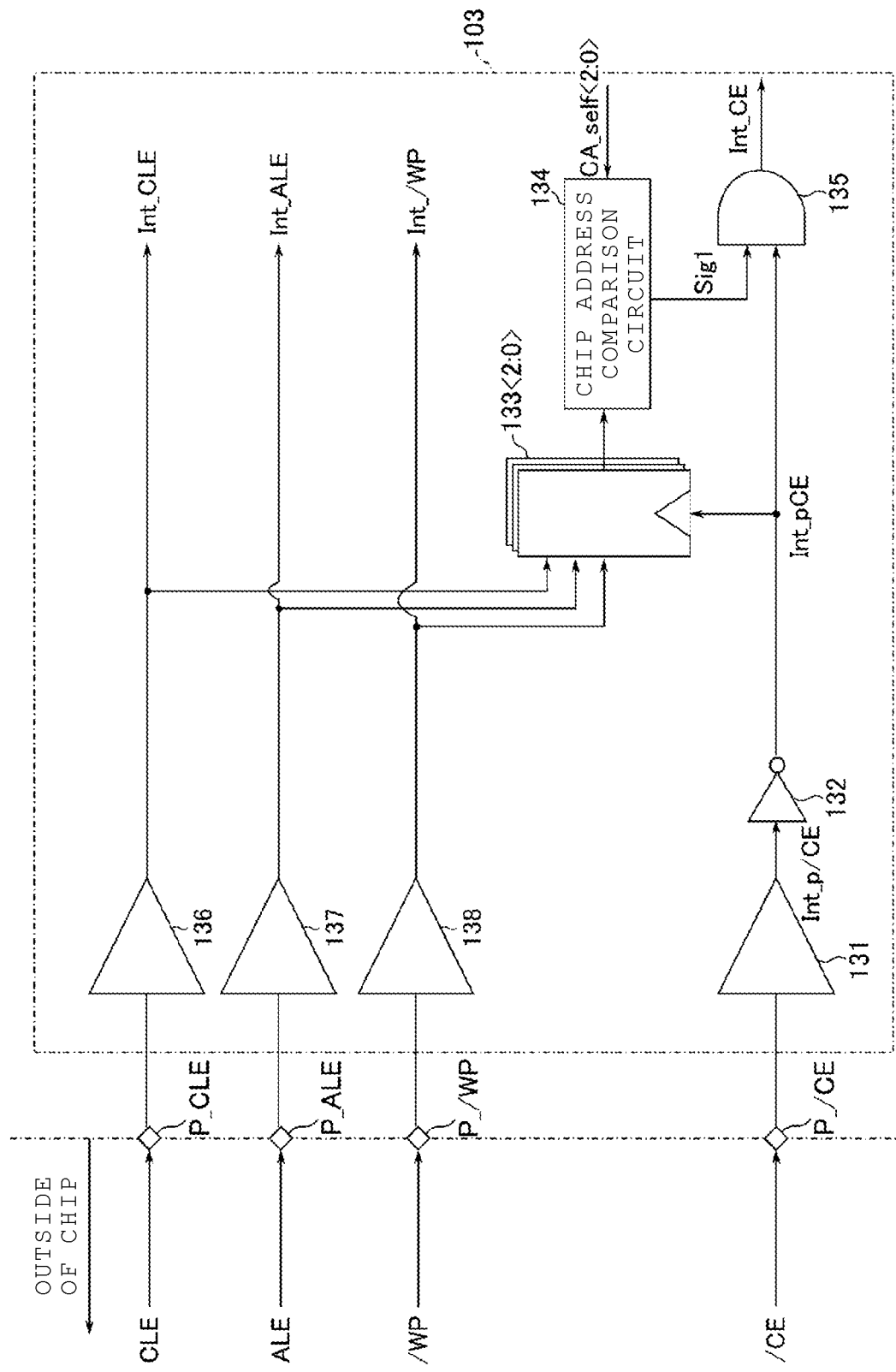
FIG. 10 is a block diagram illustrating a configuration of a logic control circuit according to a modification of the first embodiment.

FIG. 10 is a block diagram illustrating a configuration of the logic control circuit 103 according to a modification of the first embodiment. FIG. 10 illustrates a case in which the number of bits of the chip address CA is 3 bits.

As illustrated in FIG. 10, the logic control circuit 103 further includes input drivers 136, 137, and 138.

The signals CLE, ALE, and /WP are respectively assigned to the input drivers 136 to 138. That is, each of the input drivers 136 to 138 is configured to be able to receive the signals CLE, ALE, and /WP via the memory controller 200 and the control pads P_CLE, P_ALE, and P_/WP. When the input drivers 136 to 138 respectively receive the signals CLE, ALE, and /WP, the input drivers 136 to 138 amplify the signals CLE, ALE, and /WP to generate signals Int_CLE, Int_ALE, and Int_/WP, and output the generated signals Int_CLE, Int_ALE, and Int_/WP from their respective output terminals.

Figure 14:
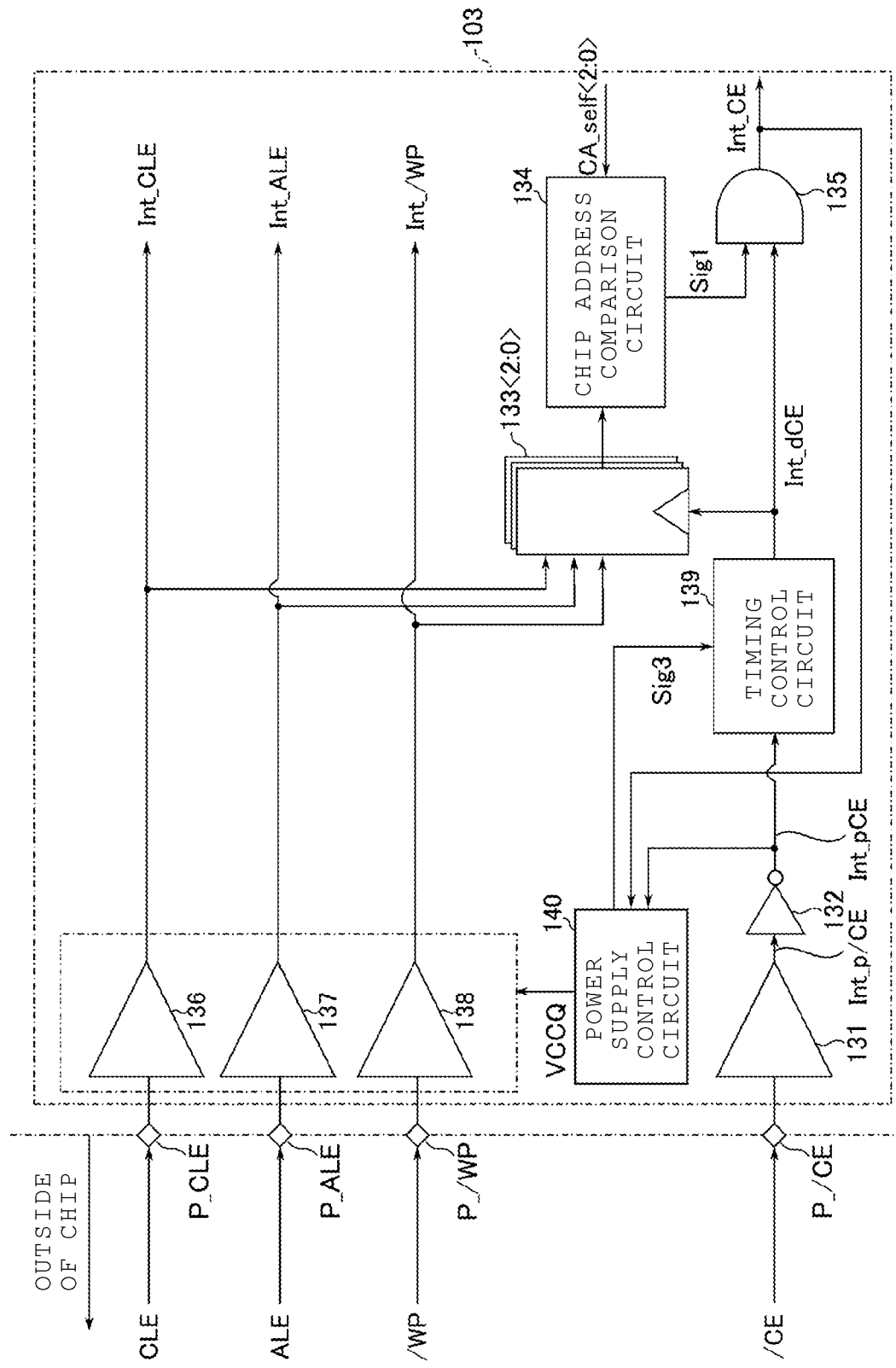
FIG. 14 is a block diagram illustrating a configuration of a logic control circuit according to a modification of the second embodiment.

A flip-flop circuit 133 (which is provided per input signal and labeled as 133<2:0> in FIGS. 10 and 14) includes: an input terminal connected to each of the output terminals of the input drivers 136 to 138; an output terminal connected to the first input terminal of the chip address comparison circuit 134; and a control terminal connected to the output terminal of the inverter 132. The flip-flop circuit 133 is triggered by the change of the signal Int_pCE inputted from the control terminal from the "L" state to the "H" state, latches the signals Int_CLE, Int_ALE, and Int_/WP for one cycle inputted from the input terminal, and outputs the latched signals from the output terminal. The flip-flop circuit 133 maintains the output of the latched information, for example, in the state where the signal Int_pCE maintains the "H" state, in the state where the signal Int_pCE changes from the "H" state to the "L" state, and in the state where the signal Int_pCE maintains the "L" state.

According to the above-described configuration, the logic control circuit 103 can fetch a chip address CA<2:0> by using the signals CLE, ALE, and /WP.

1.4.2 Chip Selection Operation

Figure 11:
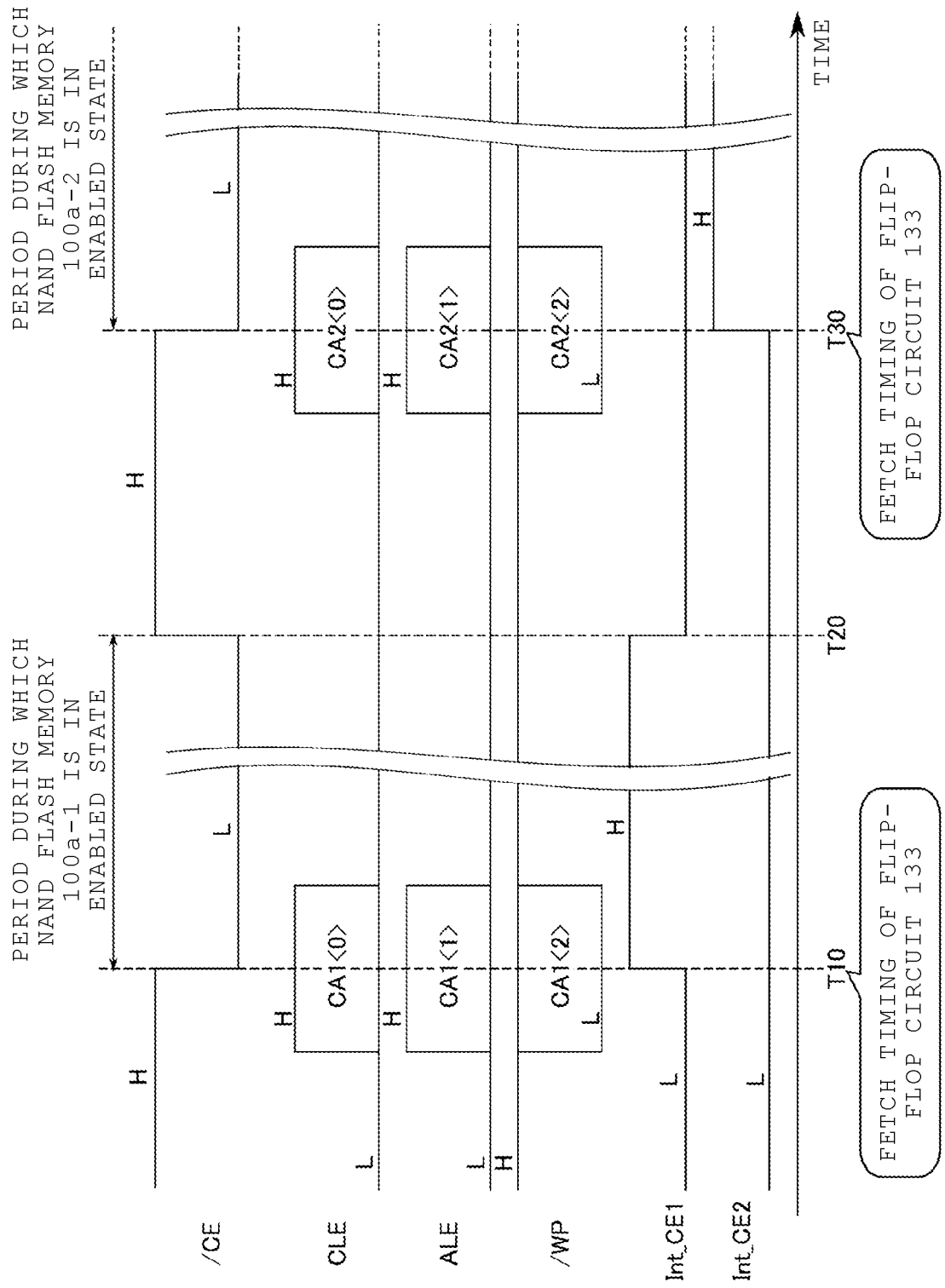
FIG. 11 is a timing chart illustrating a chip selection operation in a memory system according to the modification of the first embodiment.

FIG. 11 is a timing chart illustrating a chip selection operation in a memory system according to the modification of the first embodiment, and corresponds to FIG. 7 of the first embodiment.

As illustrated in FIG. 11, since the chip selection operation is the same as that of FIG. 7 up to the time T10, the description thereof will be omitted.

At the time T10, the signal /CE is asserted from the "H" state to the "L" state. In synchronization with the assertion of the signal /CE, the signals CLE, ALE, and /WP are respectively supplied to the respective input drivers 136-1 to 138-1 and 136-2 to 138-2. The signals CLE, ALE, and /WP respectively include CA1<0>, CA1<1>, and CA1<2> which are portions of a chip address CA1<2:0>. The input drivers 136-1 to 138-1 respectively output signals Int_CLE-1, Int_ALE-1, and Int_/WP-1, and the input drivers 136-2 to 138-2 respectively output signals Int_CLE-2, Int_ALE-2, and Int_/WP-2.

The signal /CE is asserted, whereby the signals Int_pCE-1 and Int_pCE-2 enter the "H" state. Accordingly, flip-flop circuits 133-1 and 133-2<2:0> latch the chip address CA1<2:0>.

The chip address comparison circuits 134-1 and 134-2 compare the chip address CA1<2:0> with a chip address CA_self<2:0> corresponding to itself.

Specifically, in the NAND flash memory 100a-1, the chip address CA_self<2:0> matches the chip address CA1<2:0>. Accordingly, the chip address comparison circuit 134-1 outputs the signal Sig1-1 in the "H" state. The AND circuit 135-1 outputs the signal Int_CE1 in the "H" state based upon the signal Int_pCE-1 in the "H" state and the signal Sig1-1 in the "H" state.

On the other hand, in the NAND flash memory 100a-2, the chip address CA_self<2:0> is different from the chip address CA1<2:0> (matches a chip address CA2<2:0>). Accordingly, the chip address comparison circuit 134-2 outputs the signal Sig1-2 in the "L" state. The AND circuit 135-2 outputs the signal Int_CE2 in the "L" state based upon the signal Int_pCE-2 in the "H" state and the signal Sig1-2 in the "L" state.

Accordingly, at the time T10, the NAND flash memory 100a-1 enters the enabled state, and the NAND flash memory 100a-2 enters the disabled state.

Since the operation at the time T20 is the same as that of the first embodiment, the description thereof will be omitted.

Since the operation at the time T30 is the same as the operation at the time T10 except that the chip address CA2<2:0> is fetched by the signals CLE, ALE, and /WP, the NAND flash memory 100a-1 enters the disabled state, and the NAND flash memory 100a-2 enters the enabled state, the description thereof will be omitted.

1.4.3 Effects of modification

According to the modification of the first embodiment, in synchronization with the assertion of the signal /CE, the chip address CA<2:0> can be fetched by the signals CLE, ALE and /WP other than the signal DQ<7:0>. Accordingly, when the number of bits of the chip address CA can be represented by 3 bits or less, the number of signals used for the chip selection operation can be reduced.

2. Second Embodiment

Next, a second embodiment will be described. In the first embodiment, the case where the input driver 121 is in the state of being able to receive the signal DQ<7:0> at the time when the signal /CE is asserted is described. That is, the case where the NAND flash memory 100 is configured to be able to maintain the operation of the input driver 121 even when being in the disabled state (the power supply voltage is supplied to the input driver 121 even when being in the disabled state) is described. In the second embodiment, a case where the input driver 121 is not in the state of being able to receive the signal DQ<7:0> at the time when the signal /CE is asserted will be described. That is, a case where the NAND flash memory 100 is not configured to be able to maintain the operation of the input driver 121 when being in the disabled state (the power supply voltage is not supplied to the input driver 121 when being in the disabled state) will be described. Hereinafter, the description of a configuration and an operation equivalent to those of the first embodiment will be omitted, and a configuration and an operation different from those of the first embodiment will be mainly described.

2.1 Input and output circuit and logic control circuit

Figure 12:
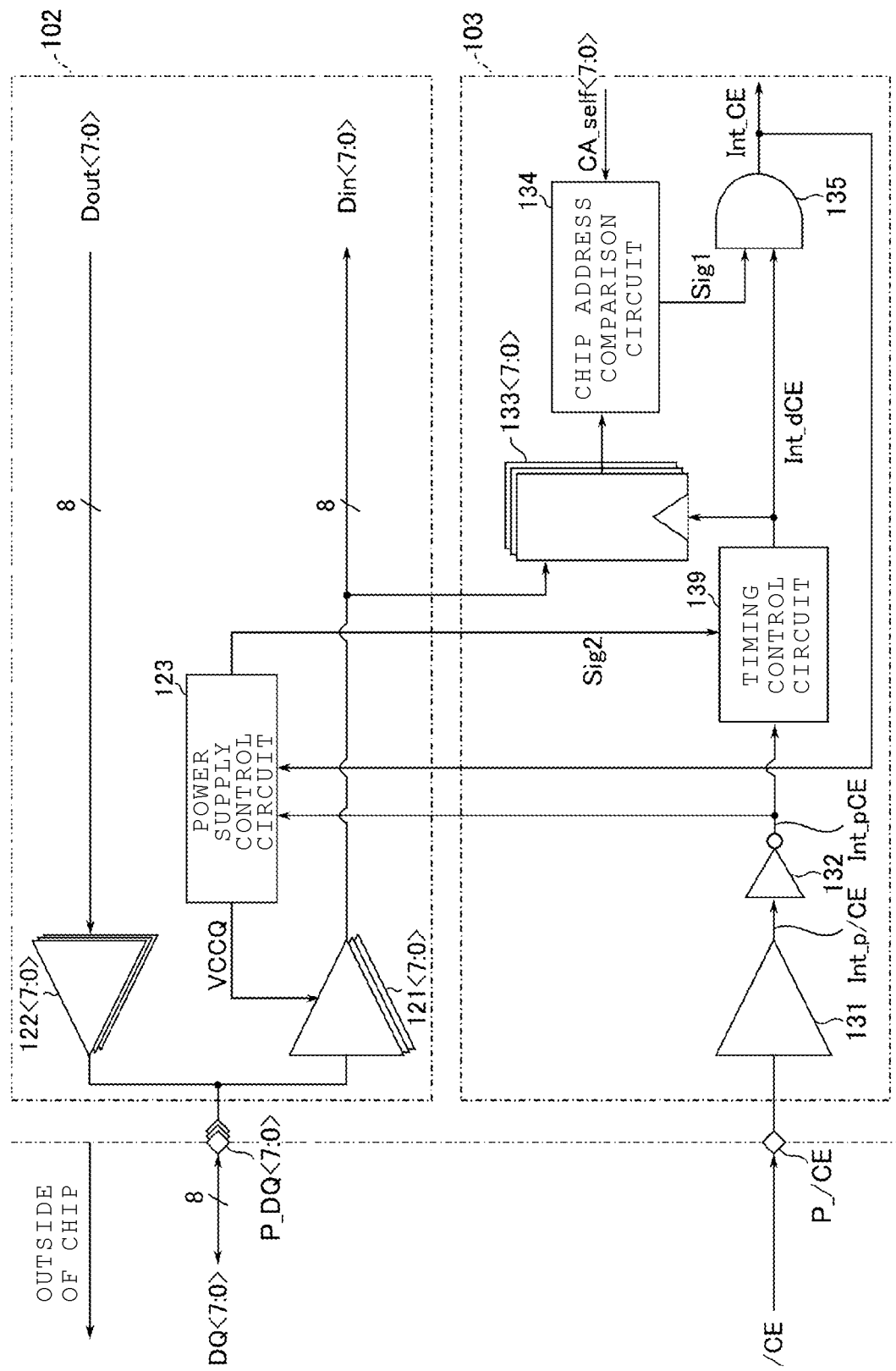
FIG. 12 is a block diagram illustrating a configuration of an input and output circuit and a logic control circuit according to a second embodiment.

FIG. 12 is a block diagram illustrating an input and output circuit and a logic control circuit according to the second embodiment, and corresponds to FIG. 6 in the first embodiment.

As illustrated in FIG. 12, the input and output circuit 102 further includes a power supply control circuit 123, and the logic control circuit 103 further includes a timing control circuit 139.

The power supply control circuit 123 includes: a first input terminal to which the signal Int_pCE from the inverter 132 is inputted; a second input terminal to which the signal Int_CE from the AND circuit 135 is inputted; a first output terminal capable of supplying a voltage VCCQ to the input driver 121; and a second output terminal that outputs a signal Sig2 to the timing control circuit 139. The voltage VCCQ is a power supply voltage for driving the input driver 121. When the signal Int_pCE switches from the "L" state to the "H" state, the power supply control circuit 123 starts to supply the voltage VCCQ to the input driver 121. After starting the supply of the voltage VCCQ thereto, the power supply control circuit 123 outputs, to the timing control circuit 139, the signal Sig2 indicating that the input driver 121 can receive the signal DQ<7:0> by the supply of the voltage VCCQ. When the signal Int_CE switches from the "H" state to the "L" state, the power supply control circuit 123 stops the supply of the voltage VCCQ to the input driver 121.

The timing control circuit 139 includes: a first input terminal to which the signal Int_pCE from the inverter 132 is inputted; a second input terminal to which the signal Sig2 is inputted from the power supply control circuit 123; and a second output terminal that outputs a signal Int_dCE to the control terminal of the flip-flop circuit 133 and the first input terminal of the AND circuit 135. When receiving the signal Int_pCE in the "H" state, the timing control circuit 139 delays the signal Int_pCE until receiving the signal Sig2. When receiving the signal Sig2, the timing control circuit 139 outputs the delayed signal Int_pCE as the signal Int_dCE. That is, after delaying the signal Int_pCE in the "H" state until the input driver 121 enters the state of being able to receive the signal Int_pCE, the timing control circuit 139 outputs the delayed signal Int_pCE as the signal Int_dCE.

2.2 Chip selection operation

Figure 13:
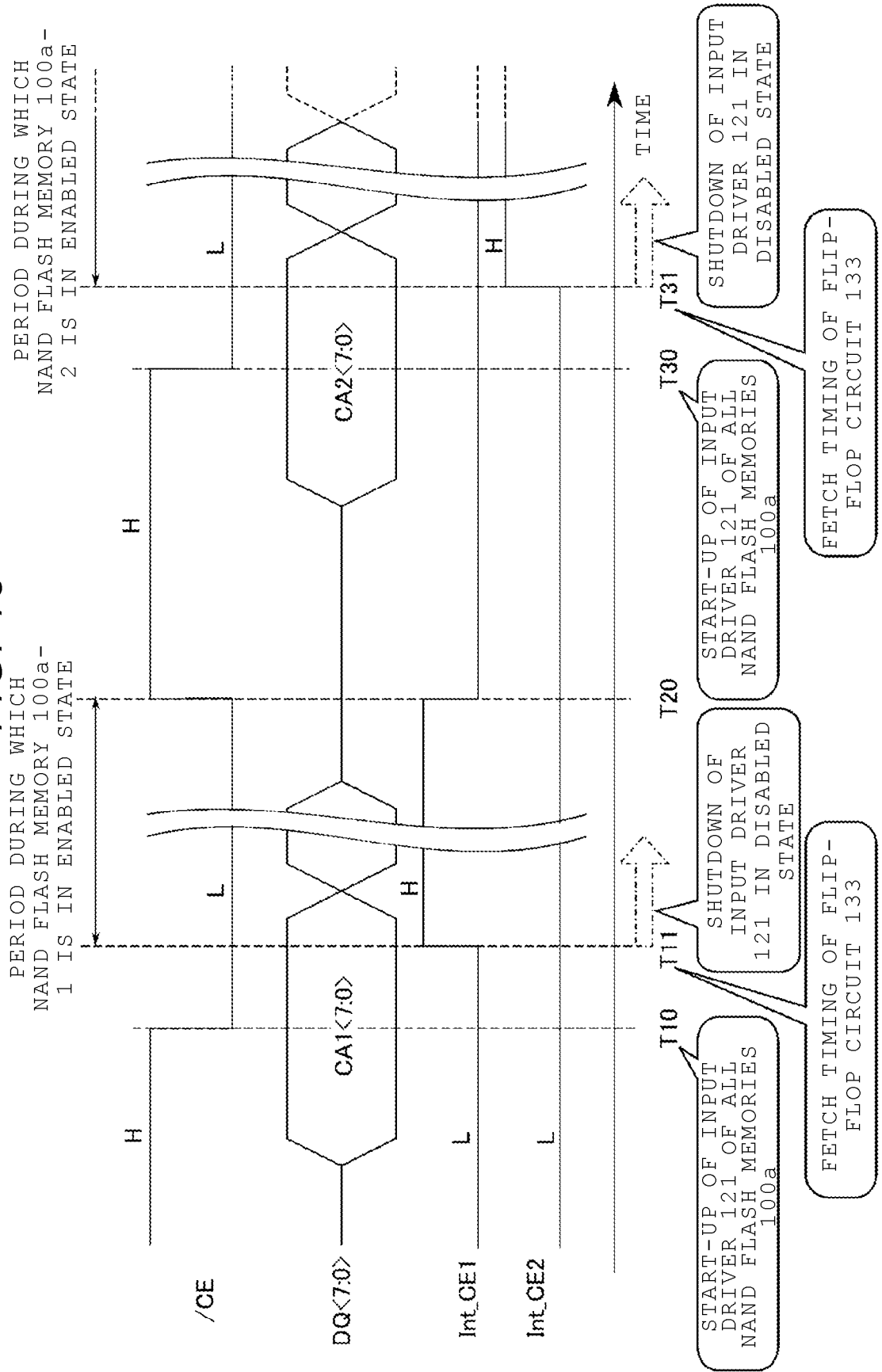
FIG. 13 is a timing chart illustrating a chip selection operation in a memory system according to the second embodiment.

FIG. 13 is a timing chart illustrating a chip selection operation in a memory system according to the second embodiment, and corresponds to FIG. 7 in the first embodiment.

As illustrated in FIG. 13, both the NAND flash memories 100a-1 and 100a-2 are in the disabled state until reaching the time T10. Accordingly, power supply control circuits 123-1 and 123-2 respectively stop the supply of the voltage VCCQ to the input drivers 121-1 and 121-2.

At the time T10, the signal /CE is asserted from the "H" state to the "L" state, and the signal DQ<7:0> including the chip address CA1<7:0> is transmitted from the memory controller 200. However, as described above, the input drivers 121-1 and 121-2 do not receive the signal DQ<7:0> because the voltage VCCQ is not supplied thereto at the time T10. In synchronization with the assertion of the signal /CE, the power supply control circuits 123-1 and 123-2 respectively start to supply the voltage VCCQ to the input drivers 121-1 and 121-2.

The timing control circuits 139-1 and 139-2 respectively receive the signals Int_pCE-1 and Int_pCE-2 in the "H" state as the signal /CE is asserted, but do not output signals Int_dCE-1 and Int_dCE-2 in the "H" state.

At time T11, the input drivers 121-1 and 121-2 enter the state of being able to receive the signal DQ<7:0>, and respectively output the signals Din-1<7:0> and Din-2<7:0>. Accordingly, the power supply control circuits 123-1 and 123-2 respectively output the signals Sig2-1 and Sig2-2 to the timing control circuits 139-1 and 139-2. When respectively receiving the signals Sig2-1 and Sig2-2, the timing control circuits 139-1 and 139-2 output the signals Int_dCE-1 and Int_dCE-2 in the "H" state. Accordingly, the flip-flop circuits 133-1 and 133-2 latch the chip address CA1<7:0>.

The input drivers 121-1 and 121-2 can enter the state of being able to receive the signal DQ<7:0> in a period shorter than one cycle of the signal DQ<7:0>. Therefore, the input drivers 121-1 and 121-2 can receive the signal DQ<7:0> while the memory controller 200 outputs the signal DQ<7:0> including the chip address CA1<7:0>.

Next, the chip address comparison circuits 134-1 and 134-2 compare the chip address CA1<7:0> with the chip address CA_self<7:0> corresponding to itself.

Specifically, in the NAND flash memory 100a-1, the chip address CA_self<7:0> matches the chip address CA1<7:0>. Accordingly, the chip address comparison circuit 134-1 outputs the signal Sig1-1 in the "H" state. The AND circuit 135-1 outputs the signal Int_CE1 in the "H" state based upon the signal Int_pCE-1 in the "H" state and the signal Sig1-1 in the "H" state.

On the other hand, in the NAND flash memory 100a-2, the chip address CA_self<7:0> is different from the chip address CA1<7:0>. Accordingly, the chip address comparison circuit 134-2 outputs the signal Sig1-2 in the "L" state. The AND circuit 135-2 outputs the signal Int_CE2 in the "L" state based upon the signal Int_pCE-2 in the "H" state and the signal Sig1-2 in the "L" state.

Accordingly, at the time T11, the NAND flash memory 100a-1 enters the enabled state and the NAND flash memory 100a-2 enters the disabled state. The power supply control circuit 123-2 stops the supply of the voltage VCCQ to the input driver 121-2 when receiving the signal Int_CE2 in the "L" state. Accordingly, the NAND flash memory 100a-2 in the disabled state can be quickly switched to the standby mode.

At the time T20, the signal /CE is negated from the "L" state to the "H" state. Accordingly, both the signals Int_CE1 and Int_CE2 enter the "L" state, and both the NAND flash memories 100a-1 and 100a-2 enter the disabled state. Accordingly, the power supply control circuit 123-1 stops the supply of the voltage VCCQ to the input driver 121-1.

At the time T30, the signal /CE is asserted from the "H" state to the "L" state, and the signal DQ<7:0> including the chip address CA2<7:0> is transmitted from the memory controller 200. However, the input drivers 121-1 and 121-2 do not receive the signal DQ<7:0> at the time T30. In synchronization with the assertion of the signal /CE, the power supply control circuits 123-1 and 123-2 respectively start to supply the voltage VCCQ to the input drivers 121-1 and 121-2.

As the signal /CE is asserted, the timing control circuits 139-1 and 139-2 respectively receive the signals Int_pCE-1 and Int_pCE-2 in the "H" state, but do not output the signals Int_dCE-1 and Int_dCE-2 in the "H" state.

At time T31, the input drivers 121-1 and 121-2 enter the state of being able to receive the signal DQ<7:0>, and respectively output the signals Din-1<7:0> and Din-2<7:0>. Accordingly, the power supply control circuits 123-1 and 123-2 respectively output the signals Sig2-1 and Sig2-2 to the timing control circuits 139-1 and 139-2. When receiving the signals Sig2-1 and Sig2-2, the timing control circuits 139-1 and 139-2 respectively output the signals Int_dCE-1 and Int_dCE-2 in the "H" state. Accordingly, the flip-flop circuits 133-1 and 133-2 latch the chip address CA2<7:0>.

The input drivers 121-1 and 121-2 can enter the state of being able to receive the signal DQ<7:0> in a period shorter than one cycle of the signal DQ<7:0>. Therefore, the input drivers 121-1 and 121-2 can receive the signal DQ<7:0> while the memory controller 200 outputs the signal DQ<7:0> including the chip address CA2<7:0>.

Next, the chip address comparison circuits 134-1 and 134-2 compare the chip address CA2<7:0> with the chip address CA_self<7:0> corresponding to itself.

In the NAND flash memory 100a-1, the chip address CA_self<7:0> is different from the chip address CA2<7:0>. Accordingly, the chip address comparison circuit 134-1 outputs the signal Sig1-1 in the "L" state. The AND circuit 135-1 outputs the signal Int_CE1 in the "L" state based upon the signal Int_dCE-1 in the "H" state and the signal Sig1-1 in the "L" state.

On the other hand, in the NAND flash memory 100a-2, the chip address CA_self<7:0> matches the chip address CA2<7:0>. Accordingly, the chip address comparison circuit 134-2 outputs the signal Sig1-2 in the "H" state. The AND circuit 135-2 outputs the signal Int_CE2 in the "H" state based upon the signal Int_dCE-2 in the "H" state and the signal Sig1-2 in the "H" state.

Accordingly, at the time T31, the NAND flash memory 100a-2 enters the enabled state and the NAND flash memory 100a-1 enters the disabled state. The power supply control circuit 123-1 stops the supply of the voltage VCCQ to the input driver 121-1 when receiving the signal Int_CE1 in the "L" state. Accordingly, the NAND flash memory 100a-1 in the disabled state can be quickly switched to the standby mode.

2.3 Effects of the Embodiment

When being in the disabled state (e.g., the standby mode), the NAND flash memory 100 according to the second embodiment is configured so that the power supply control circuit 123 stops the supply of the voltage VCCQ to the input driver 121.

According to the second embodiment, the power supply control circuit 123 starts to supply the voltage VCCQ to the input driver 121 in synchronization with the assertion of the signal /CE. Accordingly, the input driver 121-1 enters the state of being able to receive the signal DQ<7:0> with a slight delay (equal to T11-t10) after the signal /CE is asserted. The timing control circuit 139 delays the signal Int_pCE until the input driver 121 enters the state of being able to receive the signal DQ<7:0>. Next, when the input driver 121-1 enters the state of being able to receive the signal DQ<7:0>, the timing control circuit 139 outputs the delayed signal Int_pCE as the signal Int_dCE. Accordingly, the timing at which the flip-flop circuit 133 latches the signal Din<7:0> can be adjusted so as to overlap a period in which the chip address CA<7:0> is fetched as the signal Din<7:0>. Therefore, even though the input driver 121 is not in the state of being able to immediately receive the signal DQ<7:0> when the signal /CE is asserted to the input driver 121 of the NAND flash memory 100, it is possible to fetch the chip address CA<7:0> in response to the assertion of the signal /CE. Therefore, the chip selection operation can be simplified while further reducing power consumption of the NAND flash memory 100 in the standby mode, thereby making it possible to achieve the same effect as that of the first embodiment.

When receiving the signal Int_CE in the "L" state, the power supply control circuit 123 stops the supply of the voltage VCCQ to the input driver 121. Accordingly, it is possible to quickly stop the supply of the power supply voltage to the input driver 121 of the NAND flash memory 100 which is not selected in the enabled state by the chip selection operation. Therefore, it is possible to prevent an increase in the power consumption of the NAND flash memory 100 in the disabled state (the standby mode).

2.4 Modification of the Second Embodiment

The second embodiment is not limited to the above-described examples, and various modifications are applicable thereto. For example, the configuration of the modification of the first embodiment can be applied to the described-above second embodiment in the same manner as that of the first embodiment. In the following description, the description of a configuration and an operation equivalent to those of the second embodiment and the modification of the first embodiment will be omitted, and a configuration and an operation different from those of the second embodiment and the modification of the first embodiment will be mainly described.

2.4.1 Logic Control Circuit

FIG. 14 is a block diagram illustrating a configuration of the logic control circuit 103 according to a modification of the second embodiment. FIG. 14 illustrates a case where the number of bits of the chip address CA is 3 bits.

As illustrated in FIG. 14, the logic control circuit 103 further includes input drivers 136 to 138 and a power supply control circuit 140. Since configurations of the input drivers 136 to 138 are the same as those of the modification of the first embodiment, the description thereof will be omitted.

The power supply control circuit 140 includes: a first input terminal to which the signal Int_pCE from the inverter 132 is inputted; a second input terminal to which the signal Int_CE from the AND circuit 135 is inputted; a first output terminal capable of supplying the voltage VCCQ to the input drivers 136 to 138; and a second output terminal that outputs a signal Sig3 to the timing control circuit 139. When the signal Int_pCE switches from the "L" state to the "H" state, the power supply control circuit 140 starts to supply the voltage VCCQ to the input drivers 136 to 138. After starting the supply of the voltage VCCQ, the power supply control circuit 140 outputs, to the timing control circuit 139, the signal Sig3 indicating that the input drivers 136 to 138 can respectively receive the signals CLE, ALE, and /WP by the supply of the voltage VCCQ. When the signal Int_CE switches from the "H" state to the "L" state, the power supply control circuit 140 stops the supply of the voltage VCCQ to the input drivers 136 to 138.

The timing control circuit 139 receives the signal Sig3 instead of the signal Sig2 in the second embodiment. Accordingly, after delaying the signal Int_pCE in the "H" state until the input drivers 136 to 138 enter the state of being able to receive the signal Int_pCE, the timing control circuit 139 outputs the delayed signal Int_pCE as the signal Int_dCE.

According to the above-described configuration, even when the voltage VCCQ is not supplied to the input drivers 136 to 138 when the signal /CE is asserted, the logic control circuit 103 can fetch the chip address CA<2:0> by using the signals CLE, ALE, and /WP.

2.4.2 Chip Selection Operation

FIG. 15 is a timing chart illustrating a chip selection operation in a memory system according to the modification of the second embodiment, and corresponds to FIG. 13 of the second embodiment.

As illustrated in FIG. 15, since the chip selection operation is the same as that of FIG. 13 up to the time T10, the description thereof will be omitted.

At the time T10, the signal /CE is asserted from the "H" state to the "L" state, and the signals CLE, ALE, and /WP including the chip address CA1<2:0> are transmitted from the memory controller 200. However, the respective input drivers 136-1 to 138-1 and 136-2 to 138-2 do not respectively receive the signals CLE, ALE, and /WP because the voltage VCCQ is not supplied thereto at the time T10. In synchronization with the assertion of the signal /CE, the power supply control circuits 140-1 and 140-2 respectively start to supply the voltage VCCQ to the input drivers 136-1 to 138-1 and 136-2 to 138-2.

As the signal /CE is asserted, the timing control circuits 139-1 and 139-2 respectively receive the signals Int_pCE-1 and Int_pCE-2 in the "H" state, but do not output the signals Int_dCE-1 and Int_dCE-2 in the "H" state.

At the time T11, the respective input drivers 136-1 to 138-1 and 136-2 to 138-2 enter the state of being able to respectively receive the signal CLE, ALE, and /WP. Accordingly, the power supply control circuits 140-1 and 140-2 respectively output the signals Sig3-1 and Sig3-2 to the timing control circuits 139-1 and 139-2. When respectively receiving the signals Sig3-1 and Sig3-2, the timing control circuits 139-1 and 139-2 output the signals Int_dCE-1 and Int_dCE-2 in the "H" state. Accordingly, the flip-flop circuits 133-1<2:0> and 133-2<2:0> latch the chip address CA1<2:0>.

The respective input drivers 136-1 to 138-1 and 136-2 to 138-2 can enter the state of being able to respectively receive the signal CLE, ALE, and /WP in a period shorter than one cycle. Therefore, while the memory controller 200 outputs the signals CLE, ALE, and /WP including the chip address CA1<2:0>, the respective input drivers 136-1 to 138-1 and 136-2 to 138-2 can respectively receive these signals.

Next, the chip address comparison circuits 134-1 and 134-2 compare the chip address CA1<2:0> with the chip address CA_self<2:0> corresponding to itself.

Specifically, in the NAND flash memory 100a-1, the chip address CA_self<2:0> matches the chip address CA1<2:0>. Accordingly, the chip address comparison circuit 134-1 outputs the signal Sig1-1 in the "H" state. The AND circuit 135-1 outputs the signal Int_CE1 in the "H" state based upon the signal Int_dCE-1 in the "H" state and the signal Sig1-1 in the "H" state.

On the other hand, in the NAND flash memory 100a-2, the chip address CA_self<2:0> is different from the chip address CA1<2:0>. Accordingly, the chip address comparison circuit 134-2 outputs the signal Sig1-2 in the "L" state. The AND circuit 135-2 outputs the signal Int_CE2 in the "L" state based upon the signal Int_dCE-2 in the "H" state and the signal Sig1-2 in the "L" state.

Accordingly, at the time T11, the NAND flash memory 100a-1 enters the enabled state and the NAND flash memory 100a-2 enters the disabled state. The power supply control circuit 140-2 stops the supply of the voltage VCCQ to the input drivers 136-2 to 138-2 when receiving the signal Int_CE2 in the "L" state. Accordingly, the NAND flash memory 100a-2 in the disabled state can be quickly switched to the standby mode.

Since the operation at the time T20 is the same as that of the second embodiment, the description thereof will be omitted.

Since the operation at the time T30 and T31 is the same as the operation at the time T10 and T11 except that the chip address CA2<2:0> is fetched by the signals CLE, ALE, and /WP, the NAND flash memory 100a-1 enters the disabled state, and the NAND flash memory 100a-2 enters the enabled state, the description thereof will be omitted.

2.4.3 Effects of Modifications

According to the modification of the second embodiment, even when the supply of the voltage VCCQ to the input drivers 136 to 138 is stopped when the signal /CE is asserted, it is possible to fetch the chip address CA<2:0> by the signals CLE, ALE, and /WP. Accordingly, when the number of bits of the chip address CA can be represented by 3 bits or less, the number of signals used for the chip selection operation can be reduced.

3. Third Embodiment

Next, a third embodiment will be described. In the first and second embodiments, the case where the chip address CA from the memory controller 200 is fetched in the NAND flash memory 100 within a cycle in which the signal /CE is asserted is described. The third embodiment is different from the first and second embodiments in that the chip address CA is fetched in synchronization with the assertion of signals other than the signal /CE. Hereinafter, the description of a configuration and an operation equivalent to those of the first and second embodiments and the respective modifications will be omitted, and a configuration and an operation different from those of the first and second embodiments and the respective modifications will be mainly described.

3.1 Input and output circuit and logic control circuit

FIG. 16 is a block diagram illustrating an input and output circuit and a logic control circuit according to the third embodiment.

As illustrated in FIG. 16, the logic control circuit 103 further includes a chip selection determination circuit 141 and an AND circuit 142. The logic control circuit 103 does not include the timing control circuit 139. Accordingly, the power supply control circuits 123 and 140 may be configured not to output the signals Sig2 and Sig3, respectively.

The chip selection determination circuit 141 includes: an input terminal to which the signal Int_pCE from the inverter 132 is inputted; and an output terminal that outputs a signal Int_qCE to the first input terminal of the AND circuit 135. When receiving the signal Int_pCE in the "L" state, the chip selection determination circuit 141 determines whether or not the NAND flash memory 100 thereof can be in the disabled state, for example, based on a signal supplied from the sequencer 106. When determining that the disabled state can be set, the chip selection determination circuit 141 outputs the signal Int_qCE in the "L" state. On the other hand, when determining that the disabled state cannot be set, or when receiving the signal Int_pCE in the "H" state, the chip selection determination circuit 141 outputs the signal Int_qCE in the "H" state. For example, in the following cases, it is determined that the disabled state cannot be set, that is, in a case where an operation period such as a write operation and a read operation is in progress, and in a case where a sufficient time has not yet elapsed after the signal /CE has been last negated.

The AND circuit 142 includes: a first input terminal to which the signal Int_CLE is inputted from the input driver 136; a second input terminal to which the signal Int_ALE is inputted from the input driver 137; and an output terminal connected to the control terminal of the flip-flop circuit 133. The AND circuit 142 outputs, to the control terminal of the flip-flop circuit 133, a signal in the "H" state when the signals CLE and ALE simultaneously enter the "H" state, and outputs, thereto, a signal in the "L" state when at least one of the signals CLE and ALE enters the "L" state.

The flip-flop circuit 133 includes: an input terminal connected to the output terminal of the input driver 121; an output terminal connected to the first input terminal of the chip address comparison circuit 134; and a control terminal connected to the output terminal of the AND circuit 142. The flip-flop circuit 133 is triggered by the change of an output signal of the AND circuit 142 from the "L" state to the "H" state, latches the signal Din<7:0> for one cycle (that is, 8-bit information) inputted from the input terminal, and outputs the latched signal from the output terminal. The flip-flop circuit 133 maintains the output of the latched information, for example, in a state where the output signal of the AND circuit 142 maintains the "H" state, in a state where the output signal thereof changes from the "H" state to the "L" state, and in a state where the output signal thereof maintains the "L" state.

3.2 Chip Selection Operation

Next, a chip selection operation of a memory system according to the third embodiment will be described with reference to a timing chart illustrated in FIG. 17.

In the example of FIG. 17, a case where the NAND flash memory 100 in the enabled state is switched from the NAND flash memory 100a-1 to the NAND flash memory 100a-2 is illustrated.

As illustrated in FIG. 17, the signal/CE in the "L" state is supplied from the memory controller 200 until reaching time T50. The NAND flash memory 100a-1 is in the enabled state, and executes an operation such as a write operation and a read operation. That is, the chip address comparison circuit 134-1 outputs the signal Sig1-1 in the "H" state. On the other hand, since the NAND flash memory 100a-2 is in the disabled state, the chip address comparison circuit 134-2 outputs the signal Sig1-2 in the "L" state.

At the time T50, the signal/CE is negated. Accordingly, the signals Int_pCE-1 and Int_pCE-2 are switched from the "H" state to the "L" state. A chip selection determination circuit 141-1 determines that the NAND flash memory 100a-1 in operation cannot be set in the disabled state, and outputs a signal Int_qCE-1 in the "H" state. Accordingly, the signal Int_CE1 maintains the "H" state.

At time T51, the signal /CE is asserted again. In synchronization with the assertion of the signal /CE, the power supply control circuits 123-2 and 140-2 start to supply the voltage VCCQ to the input drivers 121-2, 136-2, and 137-2. Accordingly, both the NAND flash memories 100a-1 and 100a-2 enter the state of being able to receive the signals DQ<7:0>, CLE, and ALE. The chip selection determination circuits 141-1 and 141-2 respectively output the signal Int_qCE-1 in the "H" state and a signal Int_qCE-2 in the "H" state.

At time T52, the NAND flash memory 100a-1 terminates the operation being executed. The NAND flash memory 100a-1 continues to be in the enabled state.

At time T53, the signals CLE and ALE are asserted to the "H" state, and the signal DQ<7:0> including the chip address CA2<7:0> is transmitted from the memory controller 200. As described above, both the NAND flash memories

100*a*-1 and 100*a*-2 are in the state of being able to receive the signals DQ<7:0>, CLE, and ALE. Therefore, the flip-flop circuits 133-1 and 133-2 latch the chip address CA2<7:0>.

Next, the chip address comparison circuits 134-1 and 134-2 compare the chip address CA2<7:0> with the chip address CA_self<7:0> corresponding to itself.

Specifically, in the NAND flash memory 100*a*-1, the chip address CA_self<7:0> is different from the chip address CA2<7:0>. Accordingly, the chip address comparison circuit 134-1 outputs the signal Sig1-1 in the "L" state. The AND circuit 135-1 outputs the signal Int_CE1 in the "L" state based upon the signal Int_qCE-1 in the "H" state and the signal Sig1-1 in the "L" state.

On the other hand, in the NAND flash memory 100*a*-2, the chip address CA_self<7:0> matches the chip address CA2<7:0>. Accordingly, the chip address comparison circuit 134-2 outputs the signal Sig1-2 in the "H" state. The AND circuit 135-2 outputs the signal Int_CE2 in the "H" state based upon the signal Int_qCE-2 in the "H" state and the signal Sig1-2 in the "H" state.

Accordingly, at the time T53, the NAND flash memory 100*a*-1 enters in the disabled state and the NAND flash memory 100*a*-2 enters in the enabled state. The power supply control circuits 123-1 and 140-1 stop the supply of the voltage VCCQ to the input drivers 121-1, 136-1, and 137-1 when receiving the signal Int_CE1 in the "L" state. Accordingly, the NAND flash memory 100*a*-1 in the disabled state can be quickly switched to the standby mode.

At time T54, the NAND flash memory 100*a*-2 in the enabled state starts an operation such as a write operation and a read operation.

3.3 Effects of the Embodiment

According to the third embodiment, the chip selection determination circuit 141 of the NAND flash memory 100 in the enabled state determines whether or not the NAND flash memory 100 can be set in the disabled state after the signal /CE is negated. As a result of the determination, when the disabled state can be set, the signal Int_qCE outputted to the first input terminal of the AND circuit 135 is set to the "H" state, and when the disabled state cannot be set, the signal Int_qCE is set to "L" state. Accordingly, the NAND flash memory 100 in operation can be maintained in the enabled state even after the signal /CE is negated.

In synchronization with a fact that the negated signal /CE is asserted again, the power supply control circuits 123 and 140 start to supply the voltage VCCQ to the input drivers 121, 136, and 137. Accordingly, before the signals CLE and ALE that trigger the chip selection operation and the signal DQ<7:0> including the chip address CA are supplied, the input drivers 121, 136, and 137 of the NAND flash memory 100 in the disabled state can be in a state of being able to receive these signals. Therefore, after the operation of the NAND flash memory 100 in the enabled state is completed, the NAND flash memory 100 can fetch the chip address CA without considering the time required to start up the input driver. Therefore, as in the case where the input driver 121 cannot be started during one cycle of the signal DQ<7:0>, even when it takes time to start up the input driver 121, the chip selection operation can be substantially executed in one cycle.

When receiving the signal Int_CE in the "L" state, the power supply control circuits 123 and 140 stop the supply of the voltage VCCQ to the input drivers 121, 136, and 137. Accordingly, the input drivers 121, 136, and 137 of the NAND flash memory 100 that are not selected by the chip selection operation can be quickly switched to the standby mode. Therefore, it is possible to prevent an increase in the power consumption in the disabled state.

4. Others

The above-described first to third embodiments describe the case where the chip address CA is 8 bits, but are not limited thereto. For example, the chip address CA may be any number of bits of 8 bits or less. In this case, the chip selection operation may be executed by using only the input driver 121 according to the number of bits of the chip address CA. The chip address CA may be more than 8 bits. In this case, the NAND flash memory 100 repeatedly asserts the signal /CE (in the third embodiment, the signals CLE and ALE), such that the signal DQ<7:0> may be fetched over a plurality of cycles.

The above-described first and second embodiments describe the case where when the signal /CE is asserted, the chip address CA is supplied at the same time, and the above-described third embodiment describes the case where when both the signals CLE and ALE are asserted, the chip address CA is supplied at the same time, but the present disclosure is not limited thereto. For example, the chip address CA may be supplied after a predetermined number of cycles have elapsed since the signal /CE was asserted or both the signals CLE and ALE were asserted. In this case, the timing control circuit 139 does not depend on the signal Sig2 or Sig3, and may delay the signal Int_p/CE by a configuration capable of delaying a predetermined timing (for example, an even number of inverters connected in series). Accordingly, even though it takes more than one cycle to start up the input driver 121, the flip-flop circuit 133 can latch the chip address CA after the start-up of the input driver 121 is completed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
   a first pad configured to receive a first signal from a memory controller;
   a second pad configured to receive a second signal from the memory controller; and
   a first control circuit configured to set the semiconductor storage device in an enabled state or a disenabled state depending on whether or not the first signal, which is received at the first pad during a time period that starts with assertion of the second signal and is prior to receipt of a command sequence, corresponds to a first chip address.

2. The semiconductor storage device according to claim 1, wherein
   the second signal includes a chip enable signal, and
   the first control circuit is configured to determine whether or not the first signal received at the first pad corresponds to the first chip address, in synchronization with the assertion of the chip enable signal.

3. The semiconductor storage device according to claim 1, wherein the second signal includes a chip enable signal, and
the first control circuit is configured to determine whether or not the first signal received at the first pad corresponds to the first chip address, after the assertion of the chip enable signal.

4. The semiconductor storage device according to claim 3, further comprising:
a first input driver configured to receive the first signal from the first pad and to output a first internal signal, wherein
the first control circuit is configured to start power supply to the first input driver in response to the assertion of the chip enable signal, and
the first control circuit is configured to start output of the first internal signal after the power supply to the first input driver is started.

5. The semiconductor storage device according to claim 4, wherein the first control circuit is configured to, upon determining that the first signal does not correspond to the first chip address, stop the power supply to the first input driver.

6. The semiconductor storage device according to claim 1, wherein the first signal includes a data signal.

7. The semiconductor storage device according to claim 1, wherein the second signal includes one signal selected from a group consisting of:
an address latch enable signal,
a command latch enable signal, and
a write protect signal.

8. The semiconductor storage device according to claim 7, wherein signal levels of the address latch enable signal, the command latch enable signal, and the write protect signal encode a 2-bit chip address that is compared with two bits of the first chip address.

9. The semiconductor storage device according to claim 1, further comprising:
a third pad configured to receive a third signal from the memory controller, wherein
the first control circuit is configured to set the semiconductor storage device in the enabled state or the disenabled state depending on whether or not the first signal, which is received at the first pad in synchronization with assertion of the second signal after the third signal is asserted and before the receipt of a command sequence is started, corresponds to the first chip address.

10. The semiconductor storage device according to claim 9, wherein
the first signal includes a data signal,
the second signal includes at least one of a command latch enable signal and an address latch enable signal, and
the third signal includes a chip enable signal.

11. A memory system, comprising:
a memory controller;
a plurality of memory chips, each of the memory chips including a first pad and a second pad;
a first conductive line commonly connecting the first pad of each memory chip to the memory controller; and
a second conductive line commonly connecting the second pad of each memory chip to the memory controller, wherein
each of the memory chips receives a first signal at the first pad from the memory controller through the first conductive line, and receives a second signal at the second pad from the memory controller through the second conductive line, and in response to an assertion of the second signal over the second conductive line and a transmission of the first signal over the first conductive line during a time period that starts with the assertion of the chip enable signal and is prior to receipt of a command sequence, one of the memory chips enters a chip enabled state and the remainder of the memory chips enters a chip disenabled state.

12. The memory system according to claim 11, wherein each of the memory chips further includes a comparison circuit configured to compare a chip address thereof with a chip address contained in the first signal received at the first pad to determine whether to enter into the chip enabled state or the chip disenabled state.

13. The memory system according to claim 12, wherein one of the memory chips having a chip address that matches the chip address contained in the first signal received at the first pad enters the chip enabled state.

14. The memory system according to claim 11, wherein
the second pad functions as a chip enable signal pad to which a chip enable signal is input from the memory controller, and
each of the memory chips further includes
a first input driver configured to receive the first signal from the first pad and to output a first internal signal, and
a power supply control circuit configured to supply power to the first input driver in response to the receipt of the chip enable signal through the second pad, and start the output of the first internal signal when the memory chip enters the enabled state or cut off the power supplied to the first input driver when the memory chip enters the disenabled state.

15. The memory system according to claim 11, wherein the first pad functions as a data pad through which write data is received from the memory controller and through which read data is sent to the memory controller.

16. The memory system according to claim 11, wherein
the second pad functions as one pad selected from a group consisting of
an address latch enable signal pad through which an address latch enable signal is received,
a command latch enable signal pad through which a command latch enable signal is received, and
a write protect signal pad through which a write protect signal is received, and
the second signal includes one signal selected from a group consisting of
the address latch enable signal,
the command latch enable signal, and
the write protect signal.

17. The memory system according to claim 16, wherein signal levels of the address latch enable signal, the command latch enable signal, and the write protect signal encode a 2-bit chip address that is compared with two bits of a chip address of each of the memory chips.

18. The memory system according to claim 11, wherein
each of the memory chips further includes a third pad, which is connected to a third conductive line connected to the memory controller, and receives a third signal at the third pad from the memory controller through the third conductive line, and
the one of the memory chips enters the chip enabled state and the remainder of the memory chips enters the chip disenabled state in response to the assertion of the second signal over the second conductive line and the transmission of the first signal over the first conductive line after the third signal is asserted over the third conductive line and before the receipt of a command sequence is started.

19. The memory system according to claim 18, wherein the first pad functions as a data pad through which write data is received from the memory controller and through which read data is sent to the memory controller, the second pad functions as
- a command latch enable signal pad through which a command latch enable signal is received or
- an address latch enable signal pad through which an address latch enable signal is received, and the third pad functions as a chip enable signal pad to which a chip enable signal is input from the memory controller.

20. The memory system according to claim 19, wherein the one of the memory chips enters the chip enabled state and the remainder of the memory chips enters the chip disenabled state in synchronization with the assertion of the second signal over the second conductive line and the transmission of the first signal over the first conductive line after the third signal is asserted over the third conductive line and before the receipt of a command sequence is started, and the third signal is asserted over the third conductive line during data output from one of the remainder of the memory chips to the memory controller over the first conductive line.

\* \* \* \* \*